(12) United States Patent
Mazur et al.

(10) Patent No.: US 10,121,667 B2
(45) Date of Patent: Nov. 6, 2018

(54) CREATION OF HYPERDOPED SEMICONDUCTORS WITH CONCURRENT HIGH CRYSTALLINITY AND HIGH SUB-BANDGAP ABSORPTANCE USING NANOSECOND LASER ANNEALING

(71) Applicant: PRESIDENT AND FELLOWS OF HARVARD COLLEGE, Cambridge, MA (US)

(72) Inventors: Eric Mazur, Concord, MA (US); Benjamin Franta, Elkader, IA (US); Michael J. Aziz, Concord, MA (US); David Pastor, Cambridge, MA (US)

(73) Assignee: President And Fellows of Harvard College, Cambridge, MA (US)

( * ) Notice: Subject to any disclaimer, the term of this patent is extended or adjusted under 35 U.S.C. 154(b) by 0 days.

(21) Appl. No.: 15/524,539

(22) PCT Filed: Nov. 12, 2015

(86) PCT No.: PCT/US2015/060385
§ 371 (c)(1),
(2) Date: May 4, 2017

(87) PCT Pub. No.: WO2016/077587
PCT Pub. Date: May 19, 2016

(65) Prior Publication Data
US 2017/0365476 A1    Dec. 21, 2017

Related U.S. Application Data

(60) Provisional application No. 62/166,617, filed on May 26, 2015, provisional application No. 62/078,818, filed on Nov. 12, 2014.

(51) Int. Cl.
*H01L 21/00* (2006.01)
*H01L 21/268* (2006.01)
(Continued)

(52) U.S. Cl.
CPC ...... *H01L 21/2686* (2013.01); *B23K 26/0624* (2015.10); *B23K 26/0732* (2013.01);
(Continued)

(58) Field of Classification Search
CPC ........... H01L 21/02532; H01L 29/0665; H01L 31/02363; H01L 31/0288; B23K 26/0624
See application file for complete search history.

(56) References Cited

U.S. PATENT DOCUMENTS

| | | | |
|---|---|---|---|
| 5,858,473 A | 1/1999 | Yamazaki et al. | |
| 6,797,602 B1 | 9/2004 | Kluth et al. | |
| 7,057,256 B2 | 6/2006 | Carey, III et al. | |
| 7,354,792 B2 | 4/2008 | Carey, III et al. | |
| 7,781,856 B2 | 8/2010 | Mazur et al. | |
| 8,080,467 B2 | 12/2011 | Carey, III et al. | |
| 8,604,580 B2 | 12/2013 | Mazur et al. | |
| 2003/0040130 A1* | 2/2003 | Mayur | G06F 17/5018 438/14 |
| 2003/0045074 A1 | 3/2003 | Seibel et al. | |
| 2007/0241086 A1 | 10/2007 | Arao et al. | |

(Continued)

OTHER PUBLICATIONS

Peercy, et al., "Explosive crystallization in amorphous Si initiated by long pulse width laser irradiation." Applied Physics Letters, 1988; 52 (3) : 203-205.

(Continued)

*Primary Examiner* — Elias M Ullah
(74) *Attorney, Agent, or Firm* — Reza Mollaaghababa; Thomas J. Engellenner; Pepper Hamilton LLP

(57) ABSTRACT

In one aspect, a method of processing a semiconductor substrate is disclosed, which comprises incorporating at least one dopant in a semiconductor substrate so as to generate a doped polyphase surface layer on a light-trapping surface, and optically annealing the surface layer via exposure to a plurality of laser pulses having a pulsewidth in a range of about 1 nanosecond to about 50 nanoseconds so as to enhance crystallinity of said doped surface layer while maintaining high above-bandgap, and in many embodiments sub-bandgap optical absorptance.

27 Claims, 30 Drawing Sheets

(51) Int. Cl.
| | |
|---|---|
| *H01L 29/06* | (2006.01) |
| *H01L 31/0236* | (2006.01) |
| *H01L 31/18* | (2006.01) |
| *H01L 31/0288* | (2006.01) |
| *H01L 31/036* | (2006.01) |
| *H01L 31/068* | (2012.01) |
| *H01L 21/02* | (2006.01) |
| *B23K 26/0622* | (2014.01) |
| *B23K 26/073* | (2006.01) |

(52) U.S. Cl.
CPC .... *B23K 26/0738* (2013.01); *H01L 21/02532* (2013.01); *H01L 29/0665* (2013.01); *H01L 31/0288* (2013.01); *H01L 31/02363* (2013.01); *H01L 31/036* (2013.01); *H01L 31/068* (2013.01); *H01L 31/1804* (2013.01); *H01L 31/1864* (2013.01); *H01L 31/1872* (2013.01)

(56) References Cited

U.S. PATENT DOCUMENTS

| | | |
|---|---|---|
| 2012/0024364 A1 | 2/2012 | Carey, III et al. |
| 2013/0168826 A1 | 7/2013 | Vineis |

OTHER PUBLICATIONS

Smith et al., "The Origins of pressure-induced phase transformations during the surface texturing of silicon using femtosecond laser irradiation." Journal of Applied Physics, 2012; (083518) : 8 pages.
The International Search Report and Written Opinion for PCT/US15/60385, dated Jun. 20, 2016; 19 pages.

* cited by examiner

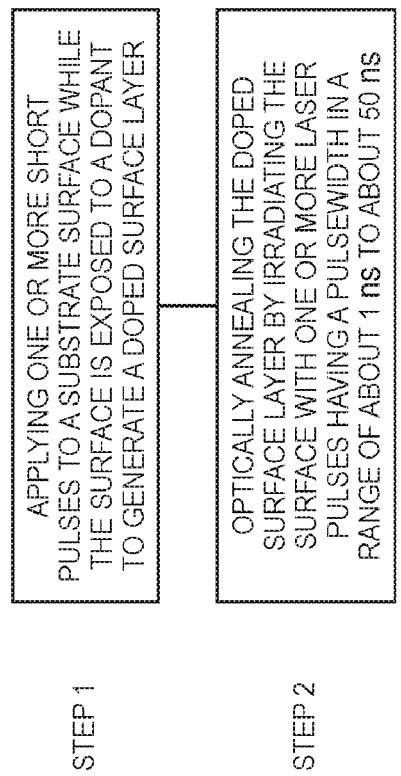

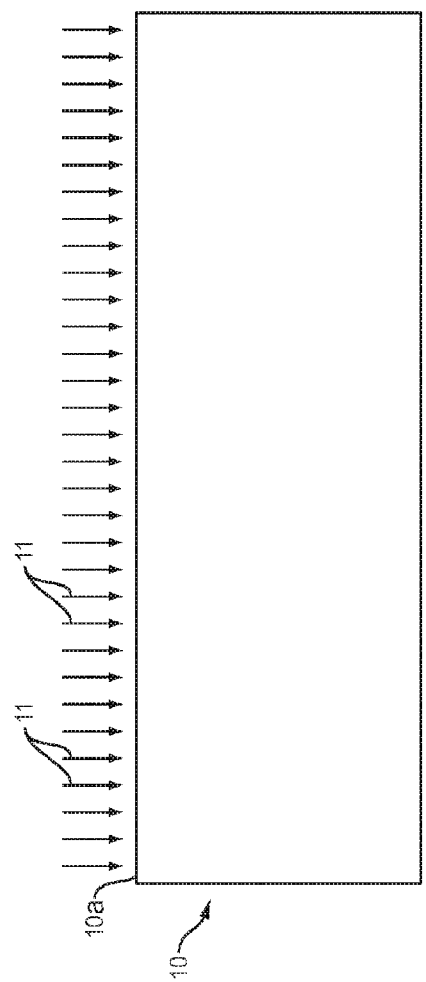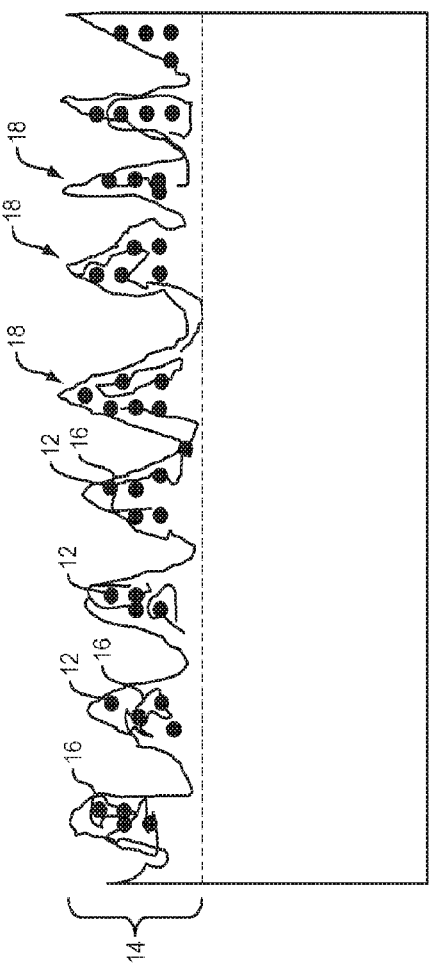

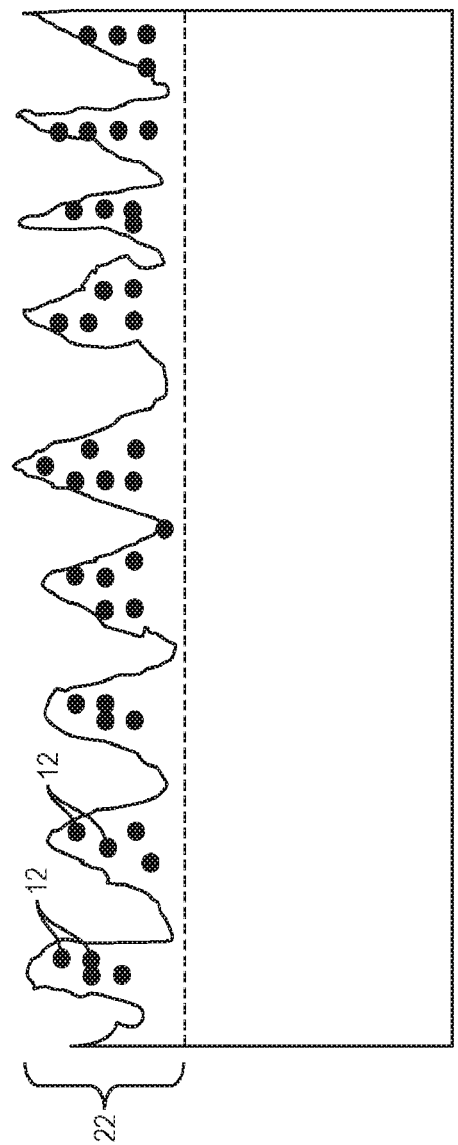

ns pulse:
none ns pulse:
1.0 J/cm² ns pulse:
2.2 J/cm² ized by a plurality of undulations having a peak-to-trough amplitude in a range of about 100 nanometers to about 100 micrometers. In some cases, the optically annealed doped surface layer has a thickness in a range of about 10 nm to about 1 micron, e.g., in a range of about 10 nm to about 200 nm.

CREATION OF HYPERDOPED SEMICONDUCTORS WITH CONCURRENT HIGH CRYSTALLINITY AND HIGH SUB-BANDGAP ABSORPTANCE USING NANOSECOND LASER ANNEALING

CROSS-REFERENCE TO RELATED APPLICATIONS

This application claims priority to PCT/US2015/060385, filed on Nov. 12, 2015 pursuant to U.S.C. § 371, which in turn claims priority to U.S. Provisional Application No. 62/078,818, filed on Nov. 12, 2014 and U.S. Provisional Application No. 62/166,617, filed on May 26, 2015, which are hereby incorporated by reference in their entirety.

GOVERNMENT SUPPORT

This invention was made with government support under FA9550-14-1-0150 awarded by U.S. Air Force Office of Scientific Research (AFOSR). The government has certain rights in the invention.

BACKGROUND

The present invention generally relates to methods and systems for generating silicon substrates having highly doped layers, and to the use of such silicon substrates for fabricating photodetectors and photovoltaic devices.

Modern semiconductor circuits are predominantly based on silicon. Silicon is an indirect band-gap semiconductor with a band-gap of about 1.05 eV. Thus, silicon is not particularly suitable for detecting radiation in the infrared portion of the electromagnetic spectrum. It is, however, known that hyperdoping silicon with a suitable dopant (e.g., sulfur) can extend the absorption spectrum of silicon to the infrared portion of the spectrum. U.S. Pat. Nos. 7,057,256, 7,354,792, 7,781,856, 8,080,467, and 8,604,580 (which are herein incorporated by reference in their entirety) disclose methods and systems for generating a hyperdoped layer in a silicon substrate, e.g., a layer with a doping concentration in a range of 0.5-1.5 atomic percent, as well as silicon with light-trapping surface structures (a silicon substrate having a hyperdoped dopant layer is herein referred to as "hyperdoped black silicon").

Hyperdoped black silicon fabricated with femtosecond laser irradiation has attracted research and commercial interest for infrared photodetectors and intermediate band photovoltaics due to its light-trapping surface and its ability to absorb sub-bandgap radiation. However, hyperdoped black silicon can contain amorphous silicon, among other material phases that may be in some cases undesirable. Thermal annealing can be employed to reduce this amorphous silicon. Thermal annealing may, however, cause a considerable decrease in the sub-bandgap radiation absorptance.

There is still a need for improved methods and systems for generating highly doped silicon substrates, which can be used for fabricating silicon-based photodetectors and photovoltaic devices.

SUMMARY

It has been discovered that hyperdoped black silicon can be treated with nanosecond pulsed laser annealing to recrystallize the doped surface layer while maintaining or increasing the sub-bandgap optical absorptance. It has been further discovered that nanosecond pulsed laser annealing can increase the crystallinity of light-trapping surface textures while preserving said surface textures. It has been further discovered that nanosecond pulsed laser annealing can increase the electrical conductivity of the doped surface layer of hyperdoped black silicon. It has been further discovered that nanosecond pulsed laser annealing can restore the sub-bandgap optical absorptance exhibited by hyperdoped black silicon after the absorptance has been reduced by thermal annealing. A hyperdoped black silicon treated with nanosecond pulsed laser annealing can be employed, for example, for fabricating silicon-based photoconductive and photovoltaic devices, including those that make use of sub-bandgap radiation. As discussed further below, the present teachings are not limited to black silicon, but rather are applicable to a variety of different semiconductor substrates.

In one aspect, a method of processing a semiconductor substrate is disclosed, which comprises incorporating at least one dopant in a semiconductor substrate so as to generate a doped polyphase surface layer, and optically annealing the surface layer via exposure to a plurality of laser pulses having a pulsewidth in a range of about 1 nanosecond to about 50 nanoseconds so as to enhance crystallinity of said doped surface layer. In some embodiments, the optical annealing pulses can have a central wavelength in a range of about 195 nm to about 355 nm, and a fluence at the substrate in a range of about 0.1 to about 2.5 J/cm$^2$.

In many embodiments, the incorporating step results in formation of a plurality of light-trapping surface textures in a top surface of the doped surface layer. In such embodiments, the optical annealing step can substantially preserve the light-trapping surface textures. In some cases, the surface textures can be character- In some embodiments, the optically annealed doped surface layer exhibits an absorptance for at least one sub-bandgap wavelength equal to or greater than about 50%, e.g., in a range of about 70% to 100%.

The optical annealing of the polyphase doped surface layer results in at least 50%, or at least 80%, and preferably about 100%, recrystallization of the polyphase layer. Such recrystallization can result in formation of a highly crystalline layer, which can include crystalline domains that are separated from one another by grain boundaries, or in some cases the highly crystalline layer can be in the form of a single crystal.

The concentration of the dopant in the doped surface layer can be greater than solid solubility limit of the dopant in the semiconductor. For example, in some embodiments, the dopant concentration can be in a range of about 0.01 to about 1.5 atom percent (e.g., in a range of about 0.1 to about 1 atom percent) in the semiconductor layer.

A variety of semiconductors and dopants can be employed. For example, the semiconductor can be any of silicon, germanium, silicon carbide, and gallium arsenide. In some embodiments, the dopant is an electron-donating species and in some embodiments the dopant is a hole-donating species. Some examples of electron-donating species, e.g., in silicon, are sulfur, selenium, and tellurium, and some examples of hole-donating species, e.g., in silicon, are boron and aluminum. In some embodiments, the semiconductor substrate is silicon and the dopant is a chalcogen.

In some embodiments, the doped surface layer is thermally annealed prior to the optical annealing step. The thermal annealing step can include exposing the doped surface layer to an elevated temperature in a range of about 200 deg. C. to about 1400 deg. C.

The incorporation of at least one dopant in a surface layer of the substrate can be achieved using a variety of different methods. For example, in some embodiments, a surface of the substrate can be irradiated with one or more short laser pulses having a pulsewidth in range of about 10 femtoseconds (fs) about 10 picoseconds (ps) while exposing the substrate surface to any of a dopant and a compound having the dopant as a constituent. For example, in some embodiments, the substrate surface can be exposed to $SF_6$ gas so as to incorporate a quantity of sulfur into a surface layer. In some embodiments, the short laser pulses for incorporating the dopant into the substrate can have a pulsewidth in a range of about 10 fs to about 1 ps, or in a range of about 50 fs to about 500 fs. The exposure of the dopant, or a compound having the dopant as a constituent, can be achieved, for example, by bringing a substrate surface into contact with a gas containing any of the dopant and a compound having the dopant as a constituent. Alternatively, a film containing any of a dopant and a compound having the dopant as a constituent can be applied to a surface of the substrate.

The short laser pulses employed for incorporating the dopant into the substrate can have a central wavelength, for example, in a range of about 200 nm to about 1200 nm, and a fluence in a range of about 1 kJ/m² to about 12 kJ/m² at the substrate surface. In many embodiments, the short laser pulses can cause the formation of light-trapping surface features (textures) on the semiconductor surface that is exposed to the pulses. Thus, in some embodiments, short laser pulses can be employed to form such surface textures either in combination with doping the substrate or in absence of such doping.

In other embodiments, the incorporation of a dopant into the semiconductor can be achieved via ion implantation. For example, a substrate surface can be bombarded with a dopant ion beam having an energy, for example, in a range of about 20 keV to about 200 keV.

In some embodiments, the optically annealed doped surface layer forms a diode junction with the underlying bulk substrate.

In a related aspect, a method of processing a semiconductor substrate is disclosed, which comprises generating a doped surface layer having a thickness in a range of about 10 nm to about 10 microns and exhibiting a plurality of light-trapping surface textures, thermally annealing said doped surface layer by exposing the substrate to an elevated temperature (e.g., a temperature in a range of about 200 deg. C. and about 1400 deg. C.), and optically annealing said thermally-annealed doped surface layer via exposure thereof to a plurality of laser pulses having a pulsewidth in a range of about 1 ns to about 50 ns, e.g., in a range of about 4 ns to about 30 ns. The optical annealing laser pulses can have a central wavelength in a range of about 195 nanometers to about 355 micrometers. The light-trapping surface textures can be characterized by a plurality of undulations having a peak-to-trough amplitude in a range of about 100 nanometers to about 100 micrometers.

In the above method, the thermal annealing step can reduce the absorptance of the doped surface layer for at least one sub-bandgap wavelength. For example the thermal annealing step can reduce the absorptance of the doped surface for one or more sub-bandgap wavelengths by a factor of at least about 10 percent. For example, in some embodiments, the doped surface layer can exhibit, prior to thermal annealing, an absorptance of at least about 50% for one or more sub-bandgap wavelengths. After thermal annealing, the absorptance of the doped surface layer can be significantly diminished. The optical annealing step, i.e., the application of the optical annealing pulses to the thermally annealed doped surface layer, can substantially restore the absorptance of the doped surface layer at said one or more sub-bandgap wavelengths to a level prior to thermal annealing step.

The dopant can have a concentration in the doped surface layer that is greater than the solid solubility limit of the dopant in the semiconductor. By way of example, the semiconductor substrate can be silicon and the dopant can be chalcogen with a concentration of about 0.01 to about 1.5 atomic percent in said doped surface layer.

In some embodiments of the above method, the step of generating a doped surface layer can include irradiating a surface of the semiconductor substrate with one or more laser pulses having a pulse width in a range of about 10 fs to about 10 ps while exposing said substrate surface to any of said dopant and a compound having said dopant as a constituent. As noted above, the step of exposing the substrate to any of the dopant and a compound having the dopant as a constituent is achieved by bringing a substrate surface into contact with a gas containing any of the dopant and a compound having that dopant as a constituent. In some other embodiments, a film containing a dopant and a compound having the dopant can be applied to a substrate surface so as to expose that surface to the dopant.

Alternatively, in some embodiments, the step of generating the doped surface layer is achieved by implanting dopant ions in the semiconductor substrate. For example, a substrate surface can be irradiated with a dopant ion beam having an energy in a range of about 20 keV to about 200 keV.

In some embodiments, the doped surface layer exhibits a polyphase structure prior to the thermal and optical annealing steps. In many such embodiments, the thermal and optical annealing steps can enhance the crystallinity of the polyphase doped surface layer. For example, after the optical annealing step, the doped surface layer can exhibit a highly crystalline structure.

In a related aspect, a semiconductor substrate is disclosed, which comprises a substantially crystalline doped surface layer having a dopant concentration in a range of about 0.01 to about 1.5 atom percent (e.g., in a range of about 0.5 to about 1.5 atom percent) and a thickness in a range of about 10 nanometers to about 1 micrometer, said doped surface layer having a plurality of light-trapping surface textures. In some embodiments, the light-trapping surface textures can have heights in a range of about 100 nm to about 100 microns. In some embodiments, the doped surface layer can have a thickness in a range of about 10 nm to about 200 nm. The doped surface layer forms a diode junction with the underlying portion of the substrate.

In some embodiments, the surface layer of the above semiconductor substrate exhibits an absorptance greater than about 50% for at least one sub-bandgap wavelength.

By way of example, the semiconductor substrate can be any of silicon, germanium, silicon carbide, and germanium arsenide. A variety of dopants, such as those disclosed above, can be employed. While in some embodiments, the dopant is an electron-donating species, in other embodiments it can be a hole-donating species. For example, the substrate can be silicon and the dopant can be a chalcogen or boron.

A method of processing a substrate is disclosed, which comprises applying a plurality of texturing laser pulses to a substrate surface so as to form a polyphase surface layer exhibiting a plurality of surface textures, optically annealing said polyphase surface layer via application of one or more pluses having a pulsewidth in a range of about 1 nanosecond to about 50 nanoseconds thereto so as to enhance crystallinity of said polyphase surface layer, wherein said optically annealed surface layer exhibits a plurality of surface textures. The surface textures of the optically annealed surface layer can be characterized by a plurality of undulations having peak-to-trough amplitudes in a range of about 100 nm to about 100 microns. In some embodiments, the texturing laser pulses have a pulsewidth in a range of about 10 fs to about 10 ps, e.g., in a range of about 50 fs to about 1 ps. In some embodiments, the substrate can be a semiconductor substrate, such as silicon, germanium, silicon carbide and gallium arsenide. Further, the dopant can be any of the dopants disclosed herein, including electron-donating and hole-donating dopants.

In one aspect, a silicon substrate having a doped layer is disclosed, which can exhibit sub-bandgap absorption for infrared wavelengths up to, and in some embodiments beyond, a wavelength of 3 micrometers (microns). In some embodiments, the doped layer includes a dopant concentration in a range of about of about 0.1 to about 1.5 atomic percent, for example, about 0.5 to about 1.5 atomic percent. By way of example, the dopant can be an electron-donating species. Some examples of suitable dopants include, without limitation, sulfur, selenium and tellurium.

In some embodiments, the doped silicon layer includes a surface layer in which the dopant are primarily concentrated. By way of example, the doped surface layer can have a thickness in a range of about 10 nanometers to about 1 micrometer with a dopant concentration in a range of about 0.1 to about 1.5 atomic percent (e.g., in a range of about 0.5 to about 1.5 atomic percent).

In some embodiments, the doped surface layer can form a p-n junction with the underlying portion of the silicon substrate. In some embodiments, such a silicon substrate can be used as an infrared photodetector or as intermediate band photovoltaic device (e.g., depending on the applied bias regime). As discussed in more detail below, such a silicon substrate can be employed to form a photodetector with higher responsivity than conventional infrared silicon photodetectors, especially in response to incident wavelengths in a range of about 1.2 to about 3.5 microns. In some embodiments, a bias voltage in a range of zero (0) to about ±15 V can be applied to the photodetector.

In a related aspect, a method for processing a silicon substrate is disclosed, which includes irradiating a surface of a silicon substrate with a plurality of short radiation pulses (e.g., laser pulses) while the surface is exposed to a dopant so as to incorporate a concentration of the dopant in a surface layer of the substrate. In some embodiments, the short radiation pulses can have a pulsewidth in a range of about 50 femtoseconds to tens of nanoseconds (e.g., 100 ns). For example, the radiation pulses can have a duration in a range of about 50 femtoseconds to about 1 picosecond, e.g., in a range of about 50 femtoseconds to about 500 femtoseconds (e.g., in a range of about 10 femtoseconds to about 100 femtoseconds). In some embodiments, the applied radiation pulses can have a fluence in a range of about 1 kJ/m$^2$ to about 8 kJ/m$^2$, and a central wavelength in range of about 200 nm to about 1200 nm (e.g., 800 nm). In some embodiments, the concentration of the dopant incorporated in the surface layer can be in a range of about 0.1 to about 1.5 atomic percent, e.g., in a range of about 0.5 to 1.5 atomic percent. The dopant can be, e.g., sulfur, selenium, or tellurium. By way of example, in some embodiments, the silicon substrate is exposed to $SF_6$ while it is irradiated with temporally short laser pulses so as incorporate a concentration of sulfur in a surface layer of the substrate.

By way of example, a system suitable for irradiating the surface of a substrate with short laser pulses is disclosed in U.S. Pat. No. 7,057,256, which is herein incorporated by reference in its entirety.

The doped surface layer generated by irradiating the silicon surface with temporally short laser pulses can contain amorphous silicon and other material phases, including pressure-induced phases. The doped surface layer is optically annealed via application of one or more radiation (e.g., laser) pulses thereto so as to increase the crystallinity of the doped surface layer. In some embodiments, the optical annealing of a doped surface layer according to the present teachings can lead to at least 70%, or at least 80%, or at least 90% recrystallization of the doped surface layer.

By way of example, a plurality of pulses with a pulse duration (pulsewidth) in a range of about 1 nanosecond to about 50 nanoseconds, e.g., 3 ns to about 30 ns, can be applied to a plurality of locations of the doped surface layer to cause melting followed by resolidification after termination of the pulse. The fluence of the optical annealing pulses can be, for example, in a range of about 0.5 to about 2.5 Joules/cm$^2$. In some embodiments, the central wavelength of the pulses utilized for optical annealing of the substrate can be, e.g., in a range of about 195 nm to about 355 nm. Without being limited to any particular theory, the pulsed laser annealing process is caused by absorption, heating, and at times melting, and resolidification. Thus, in general, any radiation wavelength that is absorbed is expected to be suitable for use in the pulsed laser annealing process. For silicon, the upper limit for the wavelength can be at least about 1100 nm (silicon bandgap), or even beyond the bandgap, e.g., up to or greater than 3 microns. In many embodiments, a single annealing pulse can be applied to each irradiated location, while in other embodiments multiple pulses can be applied to each irradiated location.

As discussed in more detail below, it has been discovered that optical annealing of the doped surface layer can increase crystallinity of the doped surface layer while maintaining the sub-bandgap optical absorption of that layer. The combination of enhanced crystallinity and sub-bandgap optical absorption characterized by enhanced absorption in the infrared portion of the spectrum can provide a number of advantages. For example, they allow fabricating photodetectors with enhanced responsivity.

In some embodiments, optical annealing according to the present teachings is performed on a semiconductor substrate having a polyphase, light-trapping textured surface that does not contain a supersaturation of dopant atoms. In such embodiments, optical annealing increases the crystallinity of the surface layer while substantially preserving the surface textures, and while minimizing energy deposition to the bulk of the semiconductor substrate.

Further understanding of various aspects of the invention can be obtained by reference to the following detailed description in conjunction with the associated drawings, which are described briefly below. The figures are not necessarily drawn to scale.

BRIEF DESCRIPTION OF THE DRAWINGS

FIG. 1 illustrates a flow chart of the method for processing a semiconductor substrate in accordance with an embodiment of the invention, FIG. 2A schematically shows a semiconductor substrate subjected to a short laser pulses in presence of a dopant for forming a doped surface layer therein, FIG. 2B schematically shows the semiconductor of FIG. 2A in which a polyphase doped surface has been formed.

FIG. 2C schematically shows the semiconductor of FIG. 2B after it has been subjected to optical annealing, FIG. 3 schematically shows an exemplary apparatus for irradiating a semiconductor with short laser pulses in presence or in absence of a dopant, FIG. 4 schematically shows an exemplary apparatus suitable for optically annealing a semiconductor substrate in accordance with the present teachings, FIG. 5 schematically shows an integrated system according to an embodiment having both a fs laser and a ns laser suitable for performing semiconductor processing methods according to the present teachings.

deactivated sub-bandgap absorptance (while crystallizing the surface); trace 3 shows that nanosecond laser annealing (fluence of 1.1 J/cm$^2$) reactivated sub-bandgap absorptance near to its original level (while maintaining high crystallinity); trace 4 shows that after electrode deposition, rapid thermal annealing (500° C., 30 sec.) again deactivated sub-bandgap absorptance; and trace 5 shows that more ns laser annealing reactivated the sub-bandgap absorptance near to its original level; the final hyperdoped black silicon diodes were highly crystalline, optically absorbing, and rectifying.

Figure 27:
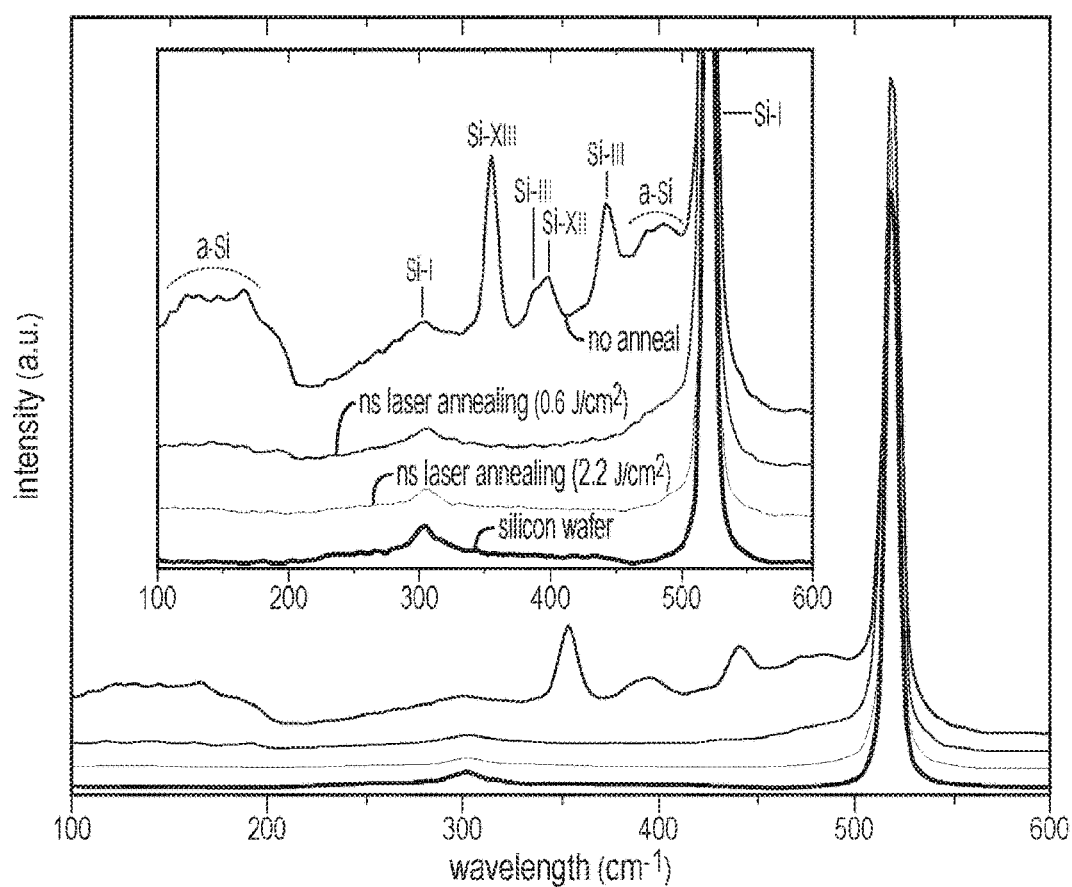

FIG. 27 illustrates Stokes Raman spectra of hyperdoped black silicon (fabricated with a fs-laser pulse fluence of 8 kJ/m$^2$) before and after ns laser annealing (normalized and offset to show individual spectra). The rescaled inset highlights Raman modes corresponding to amorphous silicon (a-Si), pressure-induced crystalline phases (Si-III and Si-XII), and conventional crystalline silicon (Si-I). Nanosecond laser annealing at low fluence (0.6 J/cm$^2$) removed the pressure-induced crystalline phases and much of the amorphous silicon, while ns laser annealing at high fluence (2.2 J/cm$^2$) removed the pressure-induced crystalline phases and nearly all of the amorphous silicon.

Figure 28A:
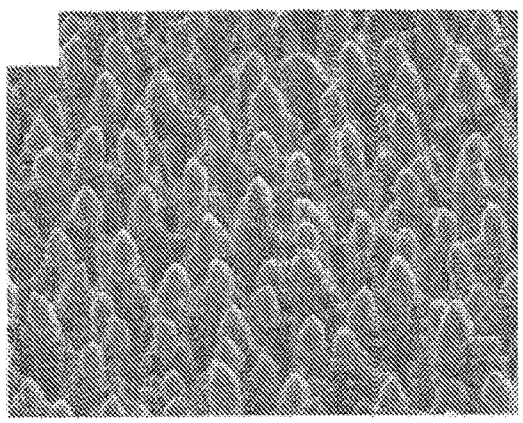
Figure 28B:
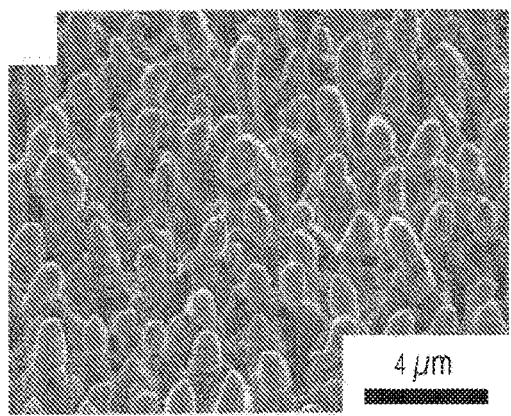
Figure 28C:
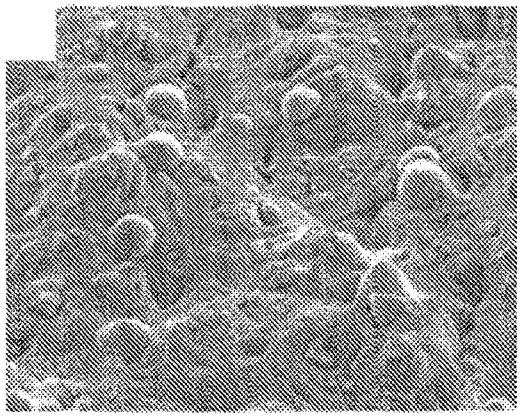

FIGS. 28A-28C illustrate (28A) hyperdoped black silicon (fabricated with a fs-laser pulse fluence of 2.5 kJ/m$^2$) with light-trapping conical surface structures about 1 µm in size. (Image obtained at 45-degree angle without foreshortening correction); (28B) Nanosecond laser annealing at low fluences (0.6 J/cm$^2$) kept the surface structures intact while crystallizing the surface; (28C) Nanosecond laser annealing at high fluences (2.2 J/cm$^2$) destroyed the surface structures.

Figure 29:
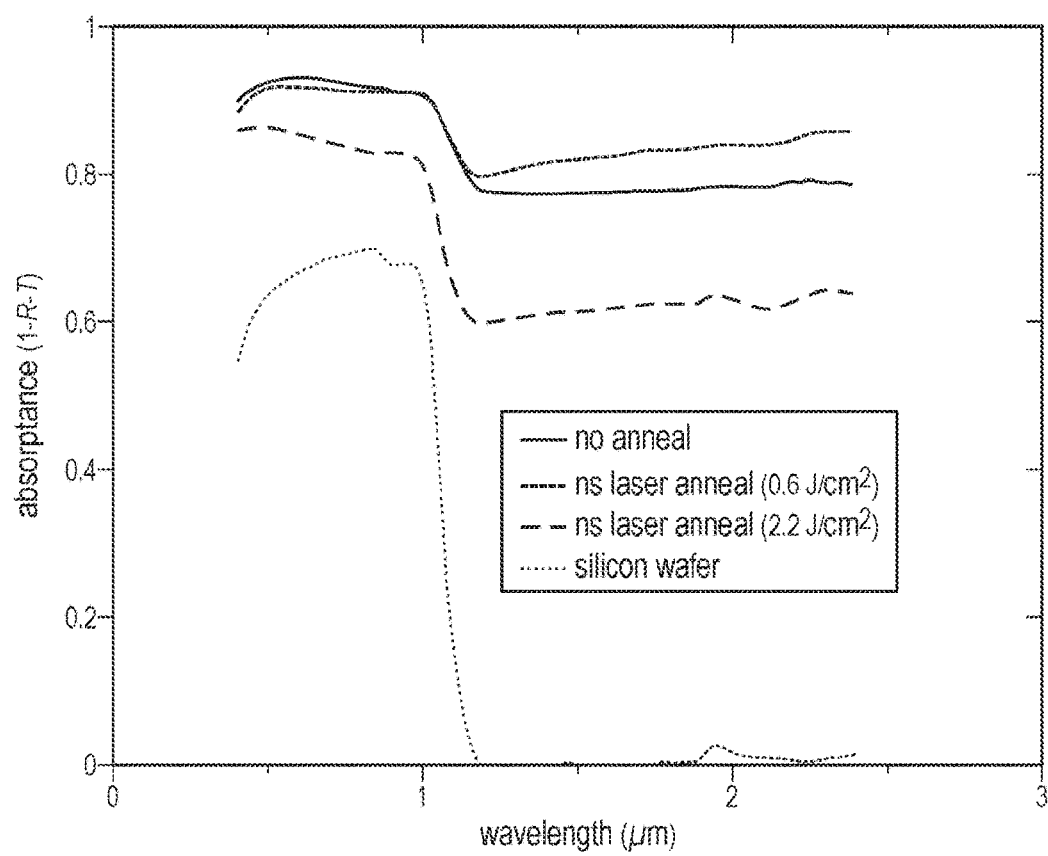

FIG. 29 illustrates nanosecond laser annealing at low fluences (e.g., 0.6 J/cm$^2$) on 1-µm scale surface structures maintained or increased the optical absorptance, but annealing at high fluences (e.g., 2.2 J/cm$^2$) decreased the optical absorptance due to the removal of the light-trapping surface structures.

DETAILED DESCRIPTION

In some aspects, the present teachings relate generally to processing a semiconductor substrate to generate a highly crystalline doped surface layer that exhibits light-trapping surface features (e.g., textures). In many embodiments, the concentration of one or more dopants in the doped surface layer is greater than the solid solubility limit of the dopant(s) in that semiconductor. The term "solid solubility limit" is used herein consistent with its ordinary meaning in the art. In particular, the solid solubility limit of a species A in a solid B refers to the maximum number of atoms of A that can be incorporated in solid B at a given temperature under conditions of thermodynamic equilibrium.

In some embodiments, the incorporation of the dopant in the semiconductor's surface layer results in formation of polyphasic doped surface layer (herein also referred to as a polyphase doped surface layer). For example, such a doped polyphasic surface layer can be formed by irradiating a semiconductor surface with one or more short laser pulses (e.g., laser pulses with a pulsewidth in a range of about 10 fs to about 10 ps) while exposing the surface to a dopant. A polyphasic surface layer can also be formed in a semiconductor substrate even in absence of doping, e.g., when a substrate's surface is irradiated with short laser pulses to form light-trapping surface features. The term "polyphase" or "polyphasic" as used herein refers to a material (e.g., a doped surface layer in some embodiments) that includes multiple material phases having distinct physical and/or chemical characteristics. In some embodiments in which the polyphasic surface layer is formed as a result of irradiation with short laser pulses, the polyphasic surface layer can include one or more material phases that are distinct from one or more phases present before irradiation. By way of example, such multiple material phases can include an amorphous phase, a pressure-induced crystalline phase, and/or microcrystalline domains. For example, when the substrate is a silicon substrate (e.g., a crystalline silicon substrate prior to formation of the polyphase layer), the polyphase layer can include amorphous silicon, silicon-HI, and/or silicon-XII. The presence of the multiple phases can be detected and quantified in a relative manner using, for example, Raman spectroscopy through analysis of features in Raman spectra associated with the phases in a manner known in the art.

It has been discovered that optically annealing the polyphase surface layer, which can be doped with a dopant in some embodiments, can enhance the crystallinity of the layer. In other words, the optical annealing can render the polyphase layer into a layer in which a single crystalline phase can compose at least 50%, or at least 80%, or at least 90%, and preferably 100% of the layer. The term "crystalline" as used herein refers to a material that is composed of a material phase characterized by a crystal atomic structure. In many embodiments, the crystalline phase of the semiconductor layer following optical annealing can be the same as the crystalline material phase present prior to formation of the polyphase layer, e.g., via irradiation with a plurality of short laser pulses (e.g., pulses with a duration of less than 10 ps). In some such embodiments, the optical annealing can result in changing the polyphase layer into a single crystal layer that has the same phase as the underlying bulk crystalline substrate. When the semiconductor is silicon, in many embodiments, the crystalline material phase generated as a result of optical annealing in accordance with the present teachings can be silicon-I. The enhancement in crystallinity of the polyphase layer can be detected, and quantified, using Raman spectroscopy through diminution or absence of features in Raman spectra associated with material phases other than the crystalline material phase generated via optical annealing, which were present in the polyphase layer. In some embodiments, the highly crystalline layer generated via optical annealing of the polyphase layer can have a single crystalline phase, that is, it lacks grain boundaries. In other embodiments, the highly crystalline layer can include a plurality of crystalline domains separated from one another by grain boundaries.

In some embodiments, the highly crystalline doped surface layer exhibits an absorptance of greater than 50% for one or more sub-bandgap wavelengths. A sub-bandgap radiation wavelength refers to a radiation wavelength corresponding to a photon energy that is less than the bandgap energy of the semiconductor. The bandgap energy of the semiconductor can correspond to the energy associated with a direct bandgap or an energy associated with an indirect bandgap, depending on the semiconductor. By way of example, silicon, and specifically silicon-I phase, has an indirect bandgap with a bandgap energy of about 1.1 eV (electron volt). Thus, photons with an energy less than about 1.1 eV are defined as sub-bandgap for silicon, and absorptance of such photons by silicon is considered as sub-bandgap absorptance (herein also referred to as sub-bandgap optical absorptance). Sub-bandgap optical absorptance can be analogously defined for other semiconductors. Without any loss of generality, in the embodiments discussed below it is assumed that the substrate is silicon. However, as noted above, the present teachings are applicable to a variety of different substrates.

The term "about" is used herein to indicate a variation of at most 10% about a numerical value. The term "substantial" as used herein indicates a deviation from a complete state or condition that is immaterial for the purposes of the present teachings, e.g., a deviation less than 10%.

With reference to flow chart of FIG. 1 as well as FIGS. 2A-2C, in one embodiment, a plurality of short radiation pulses (herein schematically depicted by arrows 11) are applied to a surface 10a of a silicon substrate 10 while the surface is exposed to a dopant, which can be via exposure to a compound having dopant as the constituent, so as to cause incorporation of a concentration of the dopant 12 into a textured surface layer 14 of the substrate (step 1). The surface layer can have a polyphase structure characterized, e.g., by a plurality of domains 16, such as amorphous, polycrystalline, and/or pressure-induced crystalline domains. In some embodiments, the short laser pulses can have a pulse width in a range of about 10 fs to about 10 ps, e.g., in a range of about 50 fs to about 1 ps, or in a range of about 50 fs to about 500 fs. Further, the short laser pulses can have a central wavelength in a range of about 200 nm to about 1200 nm and a fluence in a range of about 1 kJ/m$^2$ to about 12 kJ/m$^2$.

As noted above, the generated doped surface layer 14 can exhibit a polyphase structure characterized, e.g., by a plurality of amorphous, microcrystalline, and/or pressure-induced crystalline domains. Further, the doped surface layer can include a plurality of surface textures 18. By way of example, the surface structures can be characterized by surface undulations having peak-to-trough height variations (amplitudes), e.g., in a range of about 100 nanometers to about 100 microns. The concentration of the dopant in the doped surface layer can be greater than the solid solubility limit of the dopant in the semiconductor, that is, in the semiconductor prior to doping, e.g., in a range of about 0.01 to about 1.5 atom percent.

A variety of semiconductor substrates and dopants can be employed. By way of example, the semiconductor substrate can be any of silicon, germanium, silicon carbide, and gallium arsenide. In some embodiments, the dopant is an electron-donating species. By way of example, the dopant can be a chalcogen (e.g., in silicon), such as sulfur, selenium and tellurium. In some other embodiments, the dopant is a hole-donating species, such as boron and aluminum (e.g., in silicon).

In some embodiments, the teachings of the aforementioned U.S. Pat. No. 7,057,256 can be employed to generate the doped surface layer. The doped surface layer can exhibit a sub-bandgap absorptance that is much greater than sub-bandgap absorptance of the undoped semiconductor. For example, in some embodiments, the doped surface layer can exhibit an absorptance of at least one sub-bandgap wavelength that is equal to or greater than 50%, e.g., in a range of about 50% to about 70% and preferably 100%. By way of example, in some embodiments in which the semiconductor substrate is silicon, the doped surface layer can exhibit an absorptance in a range of about 0.6 to about 1 for one or more radiation wavelengths in a range of about 1 micron to greater than 5 microns, e.g., in a range of about 1 micron to about 2.5 microns.

In some embodiments, the doped surface layer can exhibit a diode junction (shown schematically by dashed line 20 in FIGS. 2B and 2C) with the underlying bulk substrate.

With continued reference to FIG. 1 as well as FIGS. 2A-2C, in a subsequent step (2), the doped surface layer is optically annealed by irradiating the surface with a plurality of laser pulses having a pulsewidth in a range of about 1 nanosecond to about 50 nanoseconds. The optical annealing pulses can have a fluence, for example, in a range of about 0.5 to about 2.5 Joules/cm$^2$. In some embodiments, the number of optical annealing pulses applied to each location of the surface (i.e., number of optical annealing pulses per location) can be in a range of 1 to about 100 pulses, e.g., in a range of 1 to about 40 pulses, and the repetition rate of the optical annealing pulses can be in a range of 1 pulse/second to about 1000 pulses/second, e.g., 10 pulses/second. The optical annealing step can enhance crystallinity of the polyphase doped surface layer. By way of example, the optical annealing can result in at least 70%, or at least 80%, and in some cases 100%, recrystallization of the polyphase doped surface layer. In particular, in many embodiments, the optical annealing step transforms the polyphase doped surface layer 14 into a highly crystalline doped layer 22, which is this embodiment is disposed within the textured surface layer 14, while substantially preserving the light-trapping surface textures 18. For example, in some embodiments, the surface texturing after optical annealing can be substantially the same as texturing prior to optical annealing. The highly crystalline doped layer can be formed substantially of a single crystal or it may include a plurality of domains of the same crystal phase separated from one another by grain boundaries.

Similar to the polyphase doped surface layer, the optically annealed doped surface layer 22 can exhibit an absorptance greater than about 50%, e.g., in a range of about 50% to 70%, or in a range of about 50% to about 80%, or in some cases 100%, for at least one sub-bandgap radiation wavelength. In many embodiments, the concentration of the dopant in the optically annealed doped surface layer remains substantially similar to its concentration in the doped surface layer prior to optical annealing. In particular, the concentration of the dopant in the doped surface layer can be greater than the solid solubility limit of the dopant in the semiconductor, that is, in the semiconductor prior to doping, e.g., in a range of about 0.01 to about 1.5 atom percent, e.g., in a range of about 0.1 to about 1.5 percent.

In addition, as noted above, the optically annealed doped surface layer can exhibit light-trapping surface textures, e.g., similar to those exhibited by the doped surface layer prior to optical annealing. For example, the surface textures can have heights in a range of about 100 nanometers to about 100 micrometers.

By way of example, in some embodiments, the optical annealing of the doped surface layer can be achieved by applying a plurality of pulses with a pulse duration in a range of about 3 ns to about 30 ns and a fluence in a range of about 0.5 to about 2.5 Joules/cm$^2$ to a plurality of locations of the silicon surface to melt the doped surface layer followed by its resolidification. Such optical annealing can advantageously enhance the crystallinity of the doped surface layer while maintaining its sub-bandgap absorption characteristics.

As noted above, in many embodiments, the doped surface layer forms a p-n junction with the underlying portion of the silicon substrate. Such a substrate can find a variety of applications. For example, such a substrate can be employed to form a photodetector or photovoltaic device.

By way of example, a photodetector according to the present teachings can include a silicon substrate having a doped surface layer generated in accordance with the present teachings, where at least a portion of the doped surface layer can be exposed to external radiation. The photodetector can include a plurality of metal contacts to allow application of a bias voltage to the doped layer (e.g. a bias voltage in range of about 0.1 to about +/−15 V), e.g., by employing a voltage source. Further, the metal contacts can allow detecting a photocurrent generated across the p-n junction in response to exposure of at least a portion of the doped surface layer to radiation, e.g., infrared radiation in range of about 1 micron to about 3 microns.

By way of example, the metal contacts can be formed by depositing a metallic coating layer on the back surface of the silicon substrate (i.e., the silicon substrate surface opposed to the surface of the doped surface layer). In some embodiments, such a metallic coating layer can substantially cover the entire back surface of the substrate. Further, a plurality of metallic electrical contacts, e.g., metallic contacts having a finger grid geometry, can be deposited on the surface of the doped surface layer such that at least a portion of the surface layer between the metal contacts can be exposed to external radiation. By way of example, the metal contacts can be generated using a chromium/gold alloy (Cr/Au). The aforementioned U.S. Pat. No. 7,057,256 provides additional details regarding formation of such metal contacts.

In some embodiments, a silicon substrate according to the present teachings can be employed to form a photovoltaic device. In particular, similar to formation of a photodetector, a plurality of metal contacts can be disposed on a silicon substrate having a doping layer according to the present teachings that forms a p-n junction with the underlying silicon, e.g., in a manner discussed above. At least a portion of the surface of the doped silicon layer is configured for exposure to external radiation, e.g., sunlight. In some embodiments, no bias voltage is applied across the doped silicon layer in such a photovoltaic device. The metal contact allow accessing a voltage generated across the p-n junction in response to exposure of the doped surface layer to external radiation.

Figure 3:
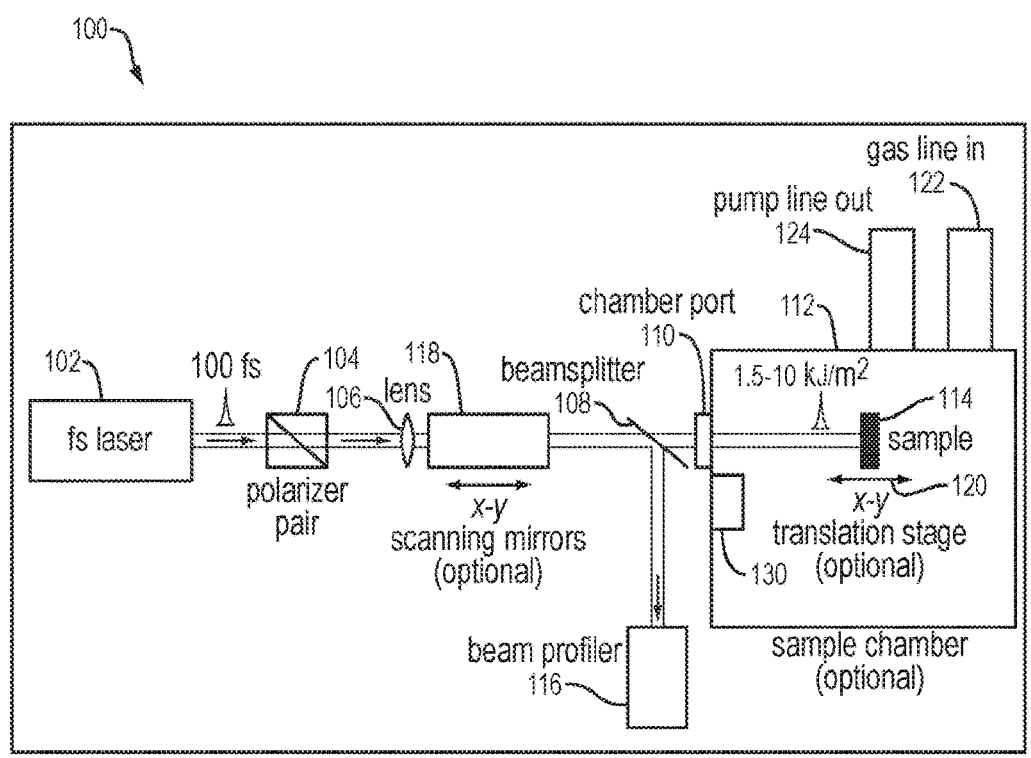

FIG. 3 schematically depicts an exemplary apparatus 100 for performing the above step of incorporating a dopant in a surface layer of a semiconductor substrate (step 1 in the flow chart of FIG. 1). The apparatus 100 includes a femtosecond laser 102, such as a femtosecond Ti:Sapphire laser, for generating short laser pulses. Without any loss of generality, in this exemplary apparatus, the femtosecond laser 102 generates laser pulses having a pulsewidth of 100 fs, though other pulsewidths can also be employed. A polarizer pair 104 can polarize the laser beam (e.g., it linearly polarizes the beam, for example, in the x-direction) and can be used to control the power of the beam. A convergent lens 106 directs the laser beam via passage through a beam splitter 108 onto an input port 110 of a chamber 112 in which a semiconductor substrate 114 is positioned so as to illuminate the substrate's surface. In this embodiment, the incident laser pulses have a fluence in a range of about 1.5 to about 10 kJ/m².

A portion of the laser beam is reflected onto a beam profiler 116 for measuring the spatial profile of the laser beam. In this embodiment, the semiconductor substrate and/or the laser beam can be moved along two dimensions orthogonal to the propagation of the laser beam (these dimensions are herein referred to as x and y dimensions) so as to allow illumination of different surface portions of the substrate by the laser pulses. More specifically, a scanning mirror system 118 can be employed to move the laser pulses across the substrate's surface and/or the semiconductor substrate can be mounted on an x-y translation stage 120 for moving the substrate relative to the incident laser pulses. A gas input line 122 allows introducing a gas into the chamber, for example, so as to expose the semiconductor surface to a dopant and/or a compound having the dopant as a constituent. Further, a pump line 124 allows connecting the chamber to a vacuum source so as to maintain the pressure within the chamber at a desired value. As discussed further below, in some embodiments, the apparatus 100 can be used to generate surface texturing on a semiconductor surface without incorporating a dopant into a surface layer of the substrate. For example, in some such cases, the semiconductor substrate can be exposed to the laser pulses without introducing a gas into the chamber and maintain the chamber at a low pressure (e.g., a pressure less than about 1 Torr). Alternatively, in some such embodiments, the chamber can be opened to the ambient environment and the semiconductor surface can be exposed to the laser pulses to generate a plurality of light-trapping surface features (textures). Further, in some such embodiments, the chamber may not be used and the sample can be mounted onto a mount and exposed to the laser pulses.

Figure 4:
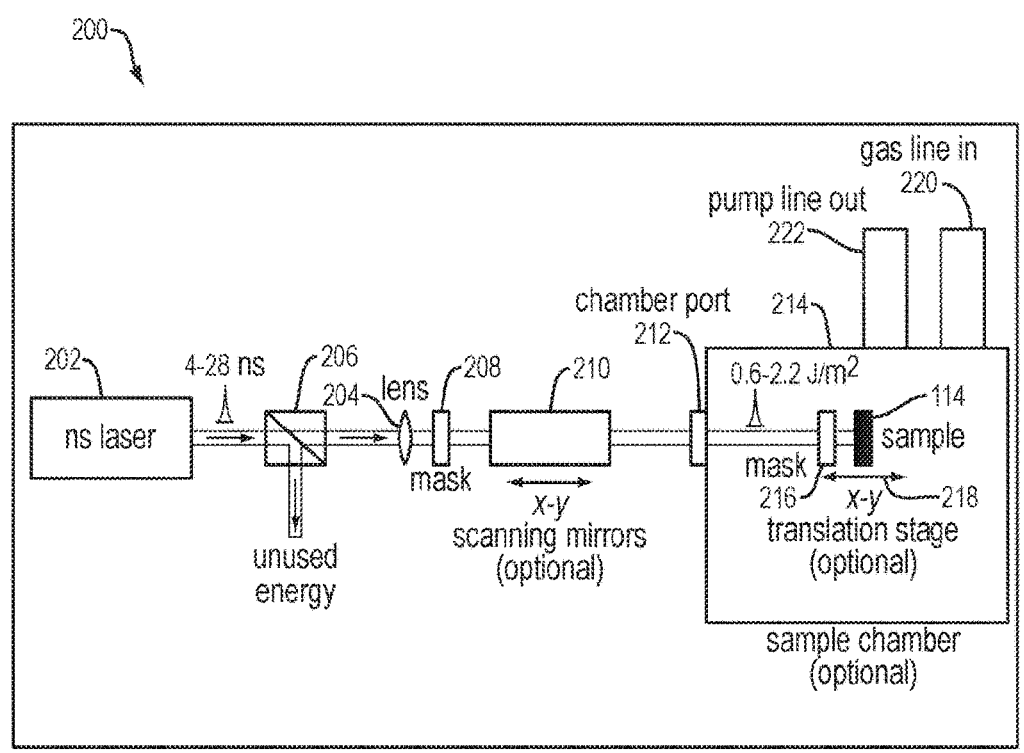

FIG. 4 schematically depicts an apparatus 200 suitable for exposing a semiconductor substrate, e.g., a doped surface layer of the substrate, to a plurality of optical annealing laser pulses. The apparatus 200 includes a laser 202 for generating nanosecond laser pulses, e.g., laser pulses having a pulsewidth in a range of about 4 ns to about 28 ns in this exemplary implementation. A variety of lasers can be employed for generating the nanosecond pulses. Some examples of suitable lasers include, without limitation, ArF excimer laser generating laser radiation at a wavelength of 193 nm and XeCl excimer laser generating laser radiation at a wavelength of 308 nm (25 ns FWHM pulse duration). In this embodiment, the fluence of the laser pulses can be controlled by combination of a convergent lens 204 for increasing the beam's fluence and a quartz window 206 for decreasing the beam's fluence via reflection of a portion thereof in a direction perpendicular to the beam's propagation direction. The reflected unused energy can be captured by a beam stopper (not shown). More specifically, a portion of each laser pulse passes through the quartz window 206 and is directed via the lens 204 to a metal mask 208, which includes a square opening through which the pulses can pass for improving the uniformity of the pulse intensity profile. By way of example, in this embodiment, the metal mask 204 includes a 2.5×2.5 mm² square opening through which the laser pulses pass, resulting in uniform pulses with fluences in a range of about 0.6 to about 2.2 J/cm². The pulses are directed via an optional x-y scanning system 210 through a port 212 of a chamber 214 in which the semiconductor substrate 114 is positioned to another metal mask 216 disposed in front of the substrate, which similar to the mask 208 includes an opening (e.g., a square opening) through which the pulses pass for improving their intensity profiles.

The rastering of the laser pulse train across the substrate's surface can be achieved by using the x-y scanning mirror system 210 and/or by using an x-y translation stage 218 on which the substrate is mounted. In this embodiment, the chamber includes a gas line 220 for introducing a gas into the chamber, if needed, and a pump line 222 for connecting the chamber to a vacuum source (not shown) for generating a controlled atmosphere within the chamber, such as, for example, creating a substantial vacuum within the chamber (e.g., a pressure of less than about 1 Torr). Alternatively, the semiconductor surface can be irradiated with the optical annealing laser pulses in ambient air.

Figure 5:
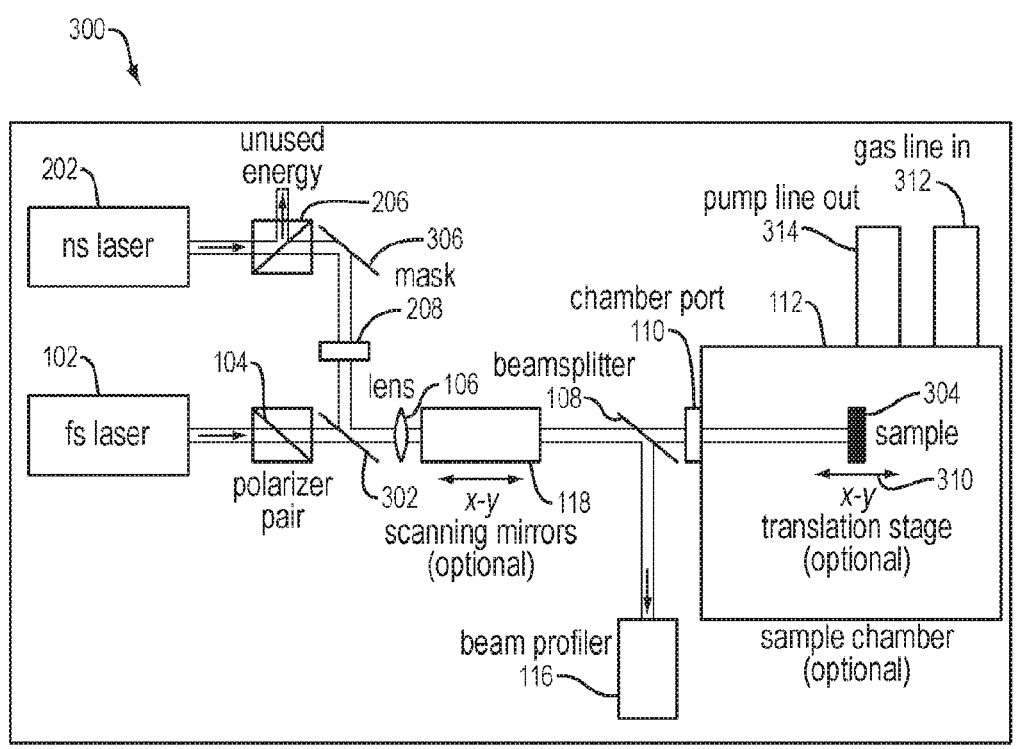

In some embodiments, an integrated system can include both the texturing/doping laser as well as the nanosecond laser. By way of example, FIG. 5 schematically depicts such an integrated system 300 that includes the fs laser 102 for generating short laser pulses for texturing and/or doping a semiconductor substrate and the ns laser 202 for optically annealing the substrate. The short laser pulses generated by the fs laser are directed via the polarizer 104, a beam splitter 302, the lens 106, the optional scanning mirror system 118, and the beam splitter 108 through the port 110 of the chamber 112 in which a semiconductor substrate 304 is positioned, onto the semiconductor surface. The beam splitter 108 reflects a portion of the laser pulses incident thereon onto the beam profiler 116 for measuring the beam's profile.

The ns laser pulses generated by the ns laser 202 pass through the quartz window 202, which reflects a portion of each pulse energy into a direction perpendicular to the propagation direction, and are reflected by a mirror 306 to the mask 208. After passage through the mask 208, the pulses are reflected by the beam splitter 302 along the propagation direction of the short laser pulses to illuminate the substrate surface. The ns laser pulses then pass through the lens 106, the optional scanning mirror system 118, the beam splitter 108 to enter the chamber 112 and illuminate the sample 304. Similar to the previous embodiment, the scanning of the fs and ns laser pulses over the substrate surface can be achieved by using the scanning mirror system 108 and/or an x-y translation stage 310 on which the substrate is mounted. A gas line 312 coupled to the chamber allows introducing a gas, e.g., a gas containing a dopant, into the chamber and a pump line 314 couples the chamber to a vacuum source to allow, for example, removal of a gas introduced into the chamber, and more generally maintaining the internal pressure of the chamber at a desired value.

Figure 6:
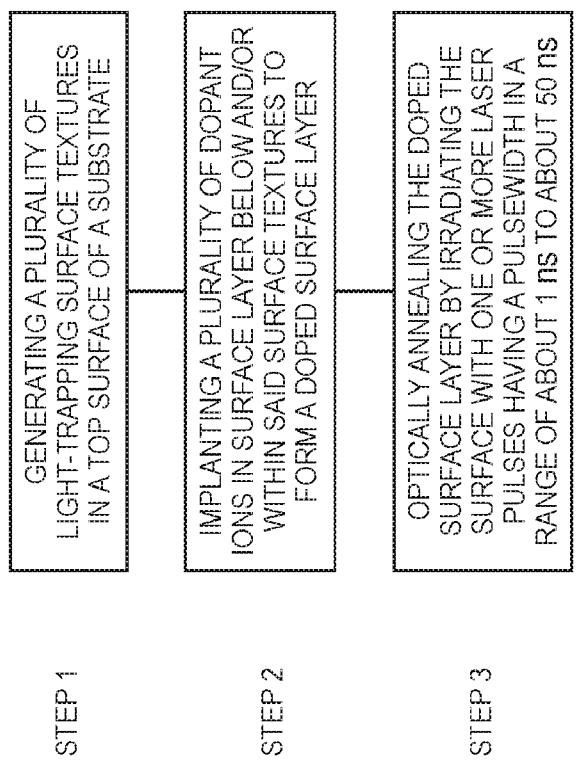
FIG. 6 is a flow chart depicting steps in an embodiment of a method for processing a semiconductor substrate in accordance with the present teachings, FIG. 7 schematically depicts an exemplary apparatus according to an embodiment of the present teachings suitable for generating light-trapping surface structures on a surface of a semiconductor substrate, implanting a dopant ion in a surface layer of the semiconductor, and optically annealing the doped surface layer.

In some embodiments, the incorporation of a dopant into a surface layer of a semiconductor substrate can be achieved via ion implantation. For example, with reference to the flow chart of FIG. 6, a plurality of light-trapping textures can be generated in a top surface of a substrate (step 1), e.g., via exposure of the surface to a plurality of short laser pulses as discussed above. Subsequently, a plurality of dopant ions can be implanted in a surface layer of the substrate below and/or within the textured surface, e.g., by directing a dopant ion beam onto the surface, to form a doped surface layer (step 2). Some examples of dopant ions include, without limitation, sulfur, selenium, and boron. In some embodiments, the ion energy can be in a range of about 20 keV to about 200 keV. The implanted ion dose can be, for example, in a range of about $10^{19}$ to about $10^{21}$ atoms/cm$^2$. The thickness of the layer in which the ions are implanted can be, for example, in a range of about 10 nm to about 1 micron, e.g., in a range of about 10 nm to about 200 nm.

Subsequent to the ion implantation step, the doped surface layer can be optically annealed by irradiating it with a plurality of laser pulses having a pulse width in a range of about 1 nanosecond to about 50 nanoseconds (step 3). Such optical annealing pulses can enhance crystallinity of the doped surface layer, e.g., via melting and resolidification thereof. Similar to the previous embodiment, the central wavelength of the optical annealing pulses can be, e.g., in a range of about 195 nm to about 355 nm.

While in the above embodiment, a plurality of light-trapping surface textures are generated in the top surface layer of the substrate prior to ion implantation, in other embodiments, such surface texturing can be generated after ion implantation. The short laser pulses employed for surface texturing can have, for example, a pulse width in a range of about 10 fs to about 10 ps, e.g., in a range of about 50 fs to about 500 fs, a central wavelength in a range of about 200 nm to about 1200 nm, and a fluence in a range of about 1 kJ/m$^2$ to about 12 kJ/m$^2$. The irradiation of the substrate's surface with such short pulses can generate a plurality of light-trapping surface textures characterized, e.g., by heights in a range of about 100 nm to about 100 microns. Nanosecond laser annealing can be performed on the surface after said ion implantation and texturizing. In this manner, a highly crystalline doped surface layer having a dopant concentration greater than the solid solubility limit of that dopant in the semiconductor substrate, e.g., in a range of about 0.01 to about 1.5 atom percent, and having light-trapping surface textures can be formed.

Figure 7:
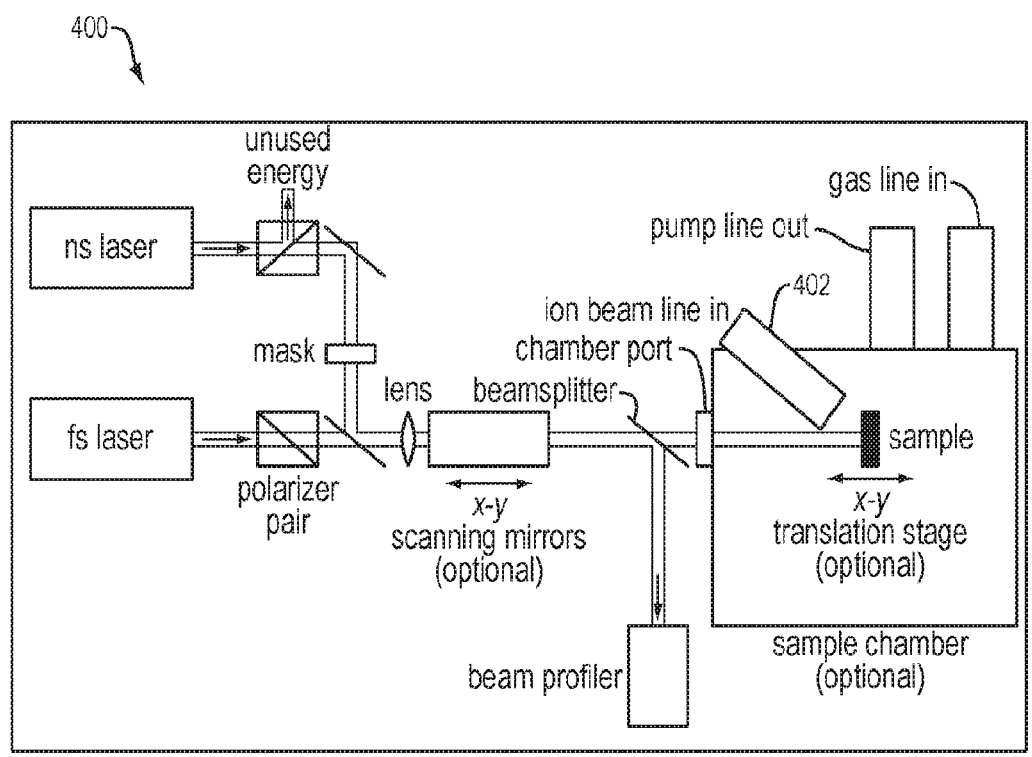

FIG. 7 schematically depicts a system 400 for performing the above method of generating a highly crystalline doped surface layer having light-trapping textures in which ion implantation is employed to introduce dopants into the surface layer. The system 400 is similar to the above system 300 having both an fs and an ns laser except for addition of an ion beam line 402 that is coupled to the chamber for bombarding the substrate with an ion beam. The ion beam line can be implemented in a variety of different ways known in the art. By way of example, an ion beam line disclosed in U.S. Pat. No. 6,797,602, which is herein incorporated by reference in its entirety may be employed. In use, the ion beam line can be employed to introduce dopant ions into a surface layer of the substrate following or followed by using the fs laser to generate light-trapping surface textures. The ns laser can then be employed to optically anneal the doped surface layer in a manner discussed above.

Figure 8:
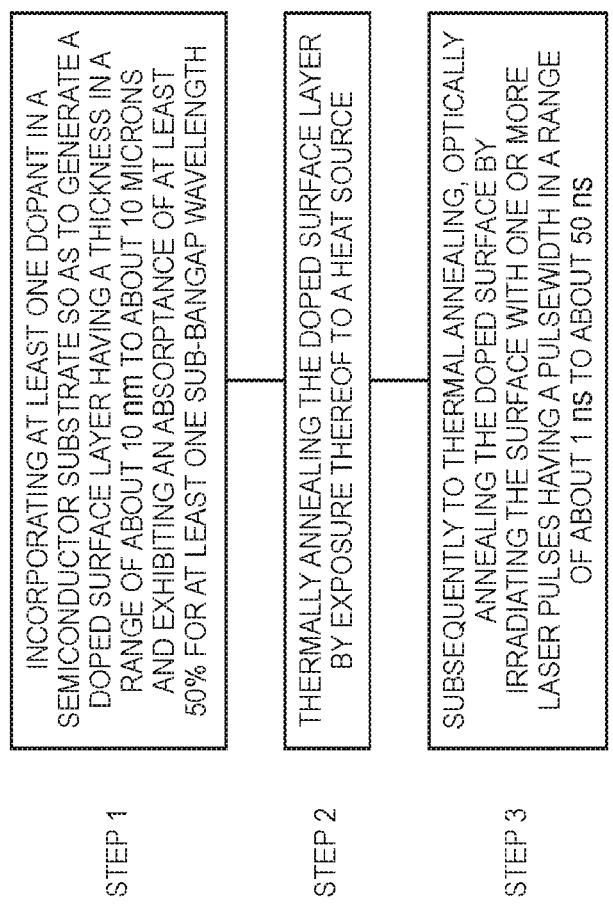
FIG. 8 is a flow chart depicting the steps of a method for processing a semiconductor according to an embodiment of the present teachings.

With reference to flow chart of FIG. 8, in another aspect, a method of processing a semiconductor substrate is disclosed, which includes incorporating at least one dopant in a semiconductor substrate so as to generate a doped surface layer having a thickness in a range of about 10 nm to about 10 microns and exhibiting an absorptance of at least 50% for at least one sub-bandgap wavelength of the incident light (step 1). The doped surface layer can have a polyphase structure. As discussed above, the incorporation of dopants in the substrate's surface layer can be achieved in a variety of different ways, e.g., by exposing a substrate's surface to a dopant while irradiating the surface with a plurality of short laser pulses, or via ion implantation. In some embodiments in which the incorporation of the dopant in the surface layer is achieved via ion implantation, prior to such doping, the substrate surface is irradiated with a plurality of short laser pulses, e.g., pulses with a pulsewidth in a range of about 10 fs to about 10 ps, to generate a plurality of surface structures in a manner discussed above. In some embodiments, the surface structures can have heights in a range of about 100 nm to about 100 microns.

Subsequently, the doped surface layer is thermally annealed, e.g., via exposure thereof to a source of heat. By way of example, the thermal annealing of the doped surface layer can be achieved by raising its temperature to an elevated value below the substrate's melting temperature, e.g., in a range of about 200 deg. C. to about 1400 deg. C. In some embodiments, the substrate can be maintained at this elevated temperature for a duration, e.g., in a range of about a few seconds (e.g., 5 seconds) to tens of minutes (e.g., 30 minutes).

Following the thermal annealing step, the doped surface layer is optically annealed by irradiating it with a plurality of laser pulses having a pulsewidth in a range of about 1 ns to about 50 ns. The other parameters of the optical annealing step, e.g., the fluence of the pulses, can be those discussed above.

The thermal annealing of the doped surface layer can enhance the crystallinity of the doped surface layer and also improve electrical rectification exhibited by the substrate due to the formation of a diode junction at the boundary between the doped surface layer and the bulk substrate. However, in many cases, the thermal annealing step causes a deactivation of the sub-bandgap optical absorptance of the doped surface layer. For example, the thermal annealing step can reduce the absorptance of the doped surface layer for one or more sub-bandgap wavelengths by at least about 10%. Without being limited to a particular theory, the deactivation of the sub-bandgap absorptance as a result of thermal annealing may be due to diffusion of the dopants to optically inactive sites.

It has been discovered that the optical annealing step can reactive the sub-bandgap optical absorptance following thermal annealing while maintaining, and in some cases enhancing, the crystallinity of the doped surface layer. For example, in some embodiments, the optical annealing step can restore the absorptance of the doped surface layer for the one or more sub-bandgap wavelengths to levels exhibited prior to thermal annealing. In this manner, the combination of thermal annealing and optical annealing can provide a semiconductor substrate having a hyperdoped surface layer with high crystallinity, high sub-bandgap (an in some cases also above-bandgap) absorptance and a rectifying homojunction.

As noted above, thermal annealing of the doped surface layer can be achieved by exposing the surface layer to heat generated by a heat source. For example, the system shown in FIG. 3 can include one or more heat lamps 130 disposed in the chamber for exposing the doped surface layer to heat to raise its temperature.

Figure 9:
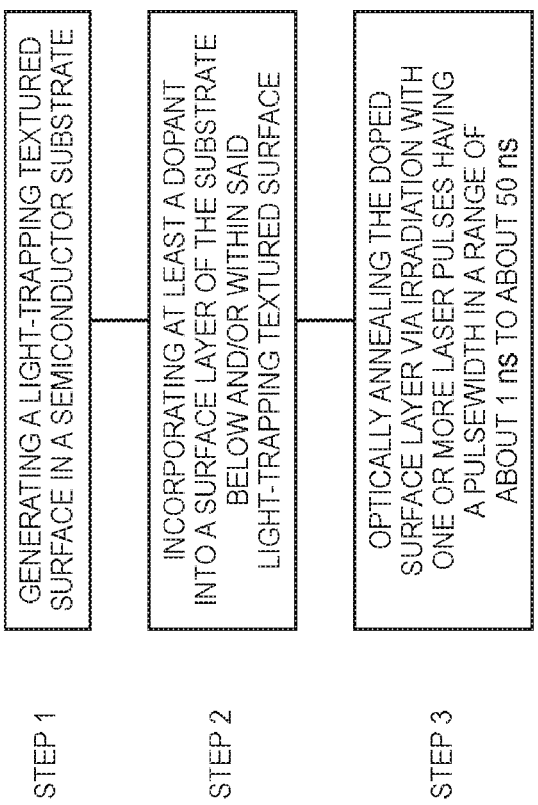
FIG. 9 is a flow chart depicting the steps of a method for processing a semiconductor substrate according to an embodiment of the present teachings.

With reference to flow chart of FIG. 9, in some embodiments, a light-trapping textured surface is generated in a semiconductor substrate, e.g., silicon, using any suitable method (step 1). For example, as discussed above, one such suitable method includes exposing the substrate's surface to a plurality of short laser pulses. Other suitable methods includes chemical etching, and direct laser etching.

Subsequently, at least one dopant can be incorporated in a surface layer of the substrate, e.g., by ion implantation or exposing a substrate's surface to a plurality of short laser pulses, so as to obtain a polyphase doped surface layer in a manner discussed above (step 2). As discussed above, such a doped surface layer can exhibit a high absorptance, e.g., an absorptance of at least 50%, for one or more sub-bandgap wavelengths. The doped surface layer can then be optically annealed via irradiation by a plurality of ns laser pulses having a pulsewidth in a range of about 1 ns to about 50 ns so as to enhance the crystallinity of the doped surface layer (step 3). In this manner, a highly crystalline doped surface layer exhibiting significant sub-bandgap absorptance and having light-trapping surface morphology can be obtained.

Figure 10:
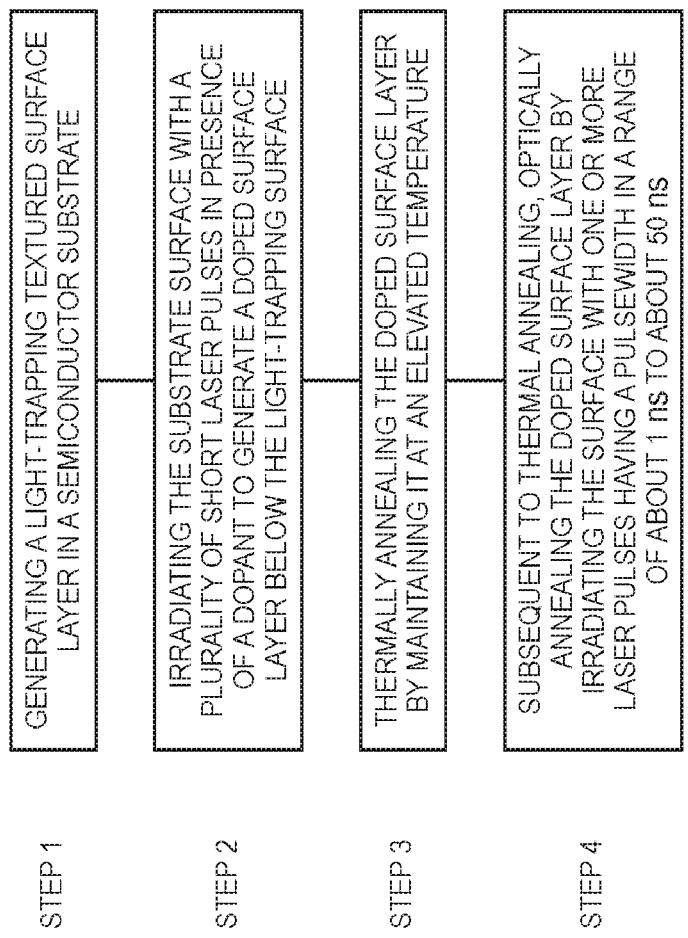
FIG. 10 is a flow chart depicting the steps of a method for processing a semiconductor substrate according to an embodiment of the present teachings.

With reference to flow chart of FIG. 10, in one embodiment, a light-trapping textured surface is generated in a semiconductor substrate, e.g., silicon, using any suitable method (step 1). For example, as discussed above, one such suitable method includes exposing the substrate's surface to a plurality of short laser pulses, chemical etching among others. Subsequently, the substrate surface is irradiated with a plurality of short laser pulses, e.g., laser pulses having a pulse width in a range of about 10 fs to about 10 ps, in presence of a dopant to so as to generate a doped, polyphase surface layer having light-trapping surface morphology (step 2). The doped surface layer is then thermally annealed (step 3), which can lead to significant deactivation of the sub-band optical absorptance exhibited by the doped surface layer. The thermally annealed doped surface layer can then be optically annealed to reactivate the sub-bandgap absorptance (step 4), thereby generating highly doped and highly crystalline surface layer exhibiting light-trapping surface morphology (texturing) and significant sub-bandgap absorptance.

Figure 11:
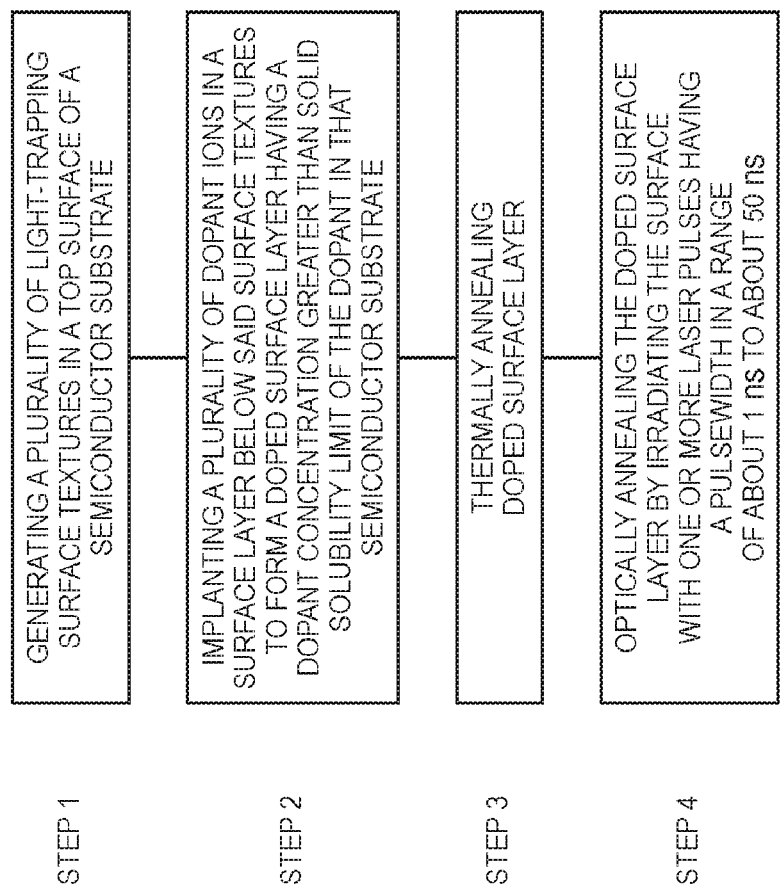
FIG. 11 is a flow chart depicting the steps of a method for processing a semiconductor substrate according to an embodiment of the present teachings.

With reference to flow chart of FIG. 11, in one embodiment, a light-trapping textured surface is generated in a semiconductor substrate, e.g., silicon, using any suitable method (step 1). For example, as discussed above, one such suitable method includes exposing the substrate's surface to a plurality of short laser pulses, chemical etching among others. Subsequently, a dopant is introduced into a surface layer of the substrate below the textured surface by implanting dopant ions into the substrate. As discussed above, such ion implantation can be achieved by exposing the substrate to an ion beam. The concentration of the dopant in the doped surface layer can be greater than solid solubility limit of the dopant in the substrate, e.g., in a range of about 0.01 to 1.5 atom percent. The doped surface layer can exhibit a significant sub-bandgap absorptance, e.g., an absorptance of at least 50%. Subsequently, the doped surface layer can be optically annealed in a manner discussed above by exposing it to one or more nanosecond laser pulses, e.g., laser pulses having a pulsewidth in a range of about 1 ns to about 50 ns to generate a highly crystalline and highly doped surface layer exhibiting light-trapping surface textures.

With reference to flow chart of FIG. 11, in one embodiment, a light-trapping textured surface is generated in a semiconductor substrate, e.g., silicon, using any suitable method (step 1). For example, as discussed above, one such suitable method includes exposing the substrate's surface to a plurality of short laser pulses, chemical etching among others. Subsequently, a dopant is introduced into a surface layer of the substrate below the textured surface by implanting dopant ions into the substrate (step 2). As discussed above, such ion implantation can be achieved by exposing the substrate to an ion beam. The concentration of the dopant in the doped surface layer can be greater than solid solubility limit of the dopant in the substrate, e.g., in a range of about 0.01 to 1.5 atom percent. The doped surface layer can be within and/or below the light-trapping textured surface.

Following the ion implantation step, the doped surface layer is thermally annealed (step 3), e.g., by maintaining it at a temperature in a range of about 200 deg. C. to about 1400 deg. C. Following the thermal annealing step, the doped surface layer can be optically annealed (step 4) in a manner discussed above by irradiating it with one or more laser pulses having a pulsewidth in range of about 1 ns to about 50 ns so as to obtain a highly crystalline doped surface layer having light-trapping surface textures.

Figure 12:
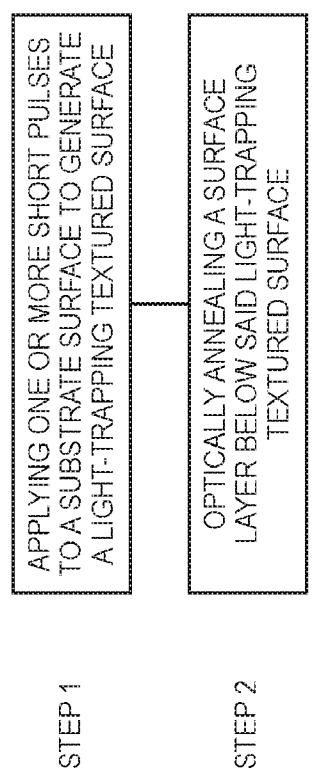
FIG. 12 is a flow chart depicting the steps of a method for processing a semiconductor substrate according to an embodiment of the present teachings, FIG. 13 schematically depicts a highly crystalline substrate according to an embodiment of the present teachings, which includes a plurality of light-trapping surface textures.
Figure 13:
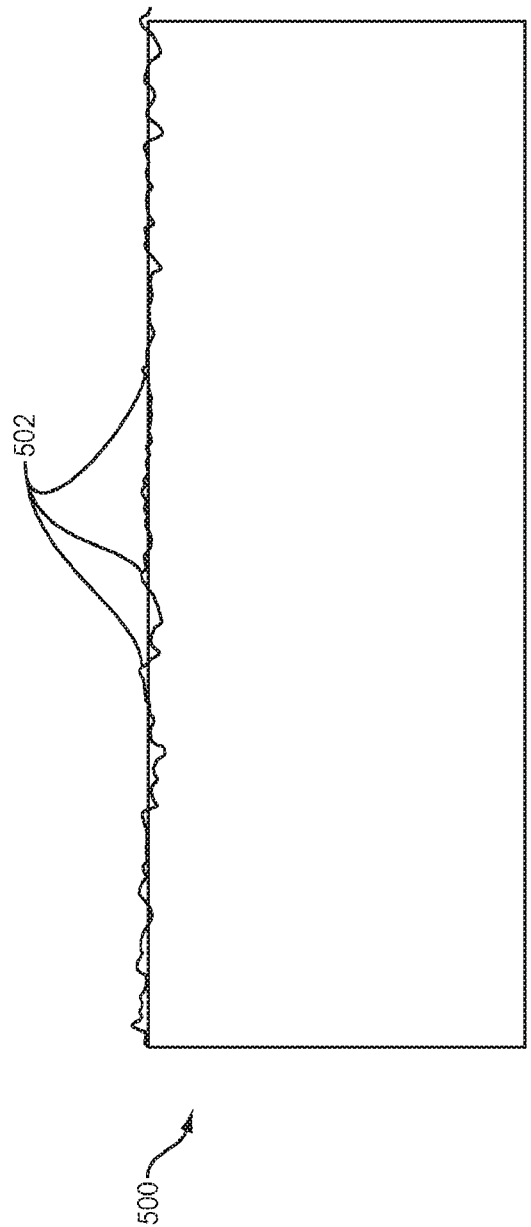

With reference to flow chart of FIG. 12, in one embodiment, short laser pulses are employed to generate light-trapping surface textures on a substrate's surface (step 1). As discussed above, such short laser pulses can have a pulse width in a range of about 10 fs to about 10 ps, e.g., in a range of about 50 fs to about 1 ps, or in a range of about 50 fs to about 500 fs, and a fluence in a range of about 1 kJ/m$^2$ to about 12 kJ/m$^2$, and a central wavelength in a range of about 200 nm to about 1200 nm. Subsequently, the substrate surface is optically annealed (step 2) via irradiation by one or more laser pulses having a pulsewidth in a range of about 1 ns to about 50 ns (e.g., in a range of about 4 ns to about 30 ns), a fluence in a range of about 0.1 to about 2.5 J/cm$^2$, and a central wavelength in a range of about 195 nm to about 355 nm. The application of the short laser pulses for generating the light-trapping surface textures can lead to formation of a polyphase surface layer below the light-trapping textured surface. The optically annealing step can in turn enhance the crystallinity of the polyphase surface layer to transform it into a highly crystalline surface layer. In many embodiments, the optical annealing step can also substantially preserve the light-trapping surface textures. As shown schematically in FIG. 13, in this manner, a highly crystalline semiconductor substrate 500, e.g., a crystalline silicon substrate, can be formed that includes light-trapping surface features (textures) 502. The surface features can have heights, e.g., in a range of about 100 nm to about 100 microns. The highly crystalline substrate can be formed substantially of a single crystal phase (e.g., at least 80 percent of the substrate can be formed of a single crystal phase) either as a plurality of domains separated by grain boundaries or as a single crystal.

The following examples are provided for illustrative purposes and for further understanding of various aspects of the invention. These examples are not intended to provide necessarily optimal ways of practicing the invention or the optimal results that can be obtained.

EXEMPLIFICATION

Example 1

Methods

A monocrystalline p-doped silicon wafer (7-14 Ohm-cm) was irradiated (<100> crystallographic orientation was used) with a plurality of femtosecond laser pulses having a duration in the range of 10-100 femtoseconds with a central wavelength of 800 nm and fluence of 8 kJ/m$^2$. This process led to the formation of a highly sulfur-doped surface layer having a textured surface exhibiting micrometer-scale spikes (such a doped wafer is herein referred to as "hyperdoped black silicon"). The silicon wafer was placed in an atmosphere of 500 Torr sulfur hexafluoride gas during irradiation. The laser pulses were produced by a Ti:Sapphire regenerative amplifier. The laser pulses impinging on the silicon surface were temporally separated from one another by 1 ms. The laser pulses had a fluence of 8 kJ/m$^2$ and a pulse diameter of 300-1000 micrometers. The laser pulses were rastered across the silicon surface using scanning galvanic mirrors so that each part of the silicon surface was irradiated with an average of 200 laser pulses as described in Smith et al., "The origins of pressure-induced phase transformations during the surface texturing of silicon using femtosecond laser irradiation," *Journal of Applied Physics,* 112, 083518 (2012), which is herein incorporated by reference in its entirety.

Subsequently, the hyperdoped black silicon samples were irradiated with nanosecond laser pulses in order to achieve pulsed laser annealing. ArF (193 nm, 10-30 ns), XeCl (308 nm, 10-30 ns), and Nd:YAG (355 nm, 4 ns) lasers were used. Each pulse had a fluence in a range of 0.5-2.5 J/cm$^2$. The laser pulses were passed through rectangular masks (1-5 mm on a side) in order to achieve nearly-uniform light intensity across the laser pulse. Nanosecond laser irradiation was performed in ambient air.

Some hyperdoped black silicon samples were treated with rapid thermal annealing (RTA) with a MPTC Rapid Thermal Processor. For example, in some cases, an RTA temperature of 500° C. was used for 30 seconds in a nitrogen gas atmosphere.

Raman spectroscopy was used to measure the crystallinity of the hyperdoped black silicon surface. A Raman spectrometer (excitation wavelength of 633 nm) was used to collect Stokes scattering spectra from the hyperdoped black silicon surface. The amount of amorphous silicon present was calculated by dividing the area under the spectrum between 470-490 cm$^{-1}$ by the area under the spectrum between 515-525 cm$^{-1}$. A grid of 100 spectra were collected over a 100×100 (μm)$^2$ area from each sample to determine the average and standard deviation values of the amorphous silicon content.

The surface electrical conductance of the samples was measured by using two tungsten needle probes that were contacted directly onto the hyperdoped black silicon surface and were separated by a distance of 3 mm. The current was measured as a function of applied voltage from −20 V to 20 V. Linear behavior was observed. Multiple measurements were performed to check for consistency. The average conductance was calculated for each sample by dividing the change in current by the change in voltage.

To measure current-voltage characteristics of a p-n junction formed between the doped silicon surface layer and the underlying silicon, metal pads were thermally evaporated onto samples using a Key High Thermal Evaporator at Harvard Center for Nanoscale Systems. Aluminum (200 nm thickness) was evaporated onto the back side of samples (contacting the p-type silicon substrate) and titanium/nickel/silver (20 nm, 20 nm, and 200 nm thickness, respectively) stacks were evaporated onto the front side of samples (contacting the hyperdoped black silicon surface). Current-voltage characteristics were measured with by placing one tungsten probe in contact with a front contact and another tungsten probe in contact with a metal chuck, which was in turn in contact with the back contact.

The optical absorption of the samples was measured using a spectrophotometer with a barium sulfate integrating sphere, which was used to measure the transmittance and reflectance of samples from 400 nm to 2500 nm. Absorptance was determined by calculating 1−transmittance−reflectance.

Results

Effect of ns Annealing on Crystallinity

Figure 15:
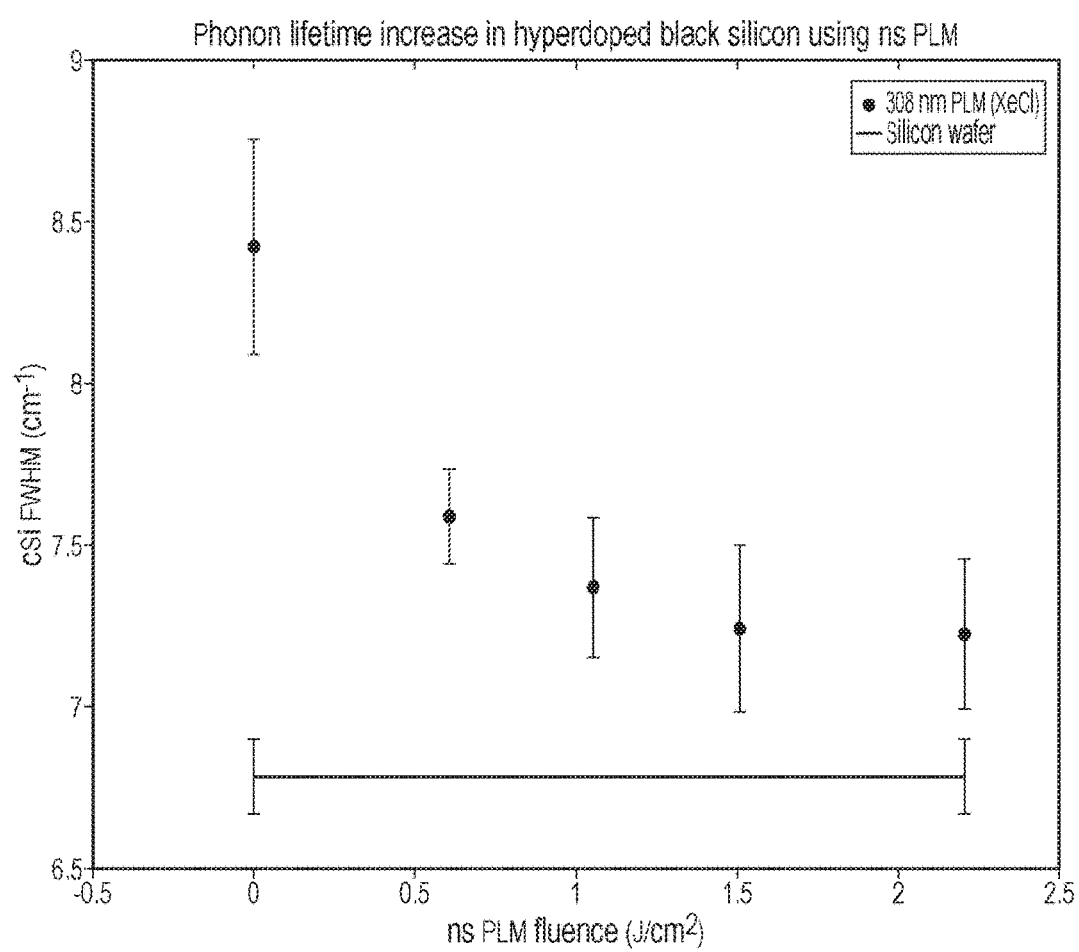
FIG. 15 is a graph of the width of the Raman peak at 520 cm$^{-1}$ associated with the crystalline silicon phase of hyperdoped black silicon fabricated with a femtosecond laser and annealed with nanosecond laser pulses. The reduction in peak width after nanosecond laser annealing indicates a reduction in grain boundary density and/or a reduction in lattice strain.

The nanosecond pulsed laser annealing increased the crystallinity of the doped surface layer. The doped silicon layer in absence of nanosecond pulsed melting exhibits a Raman peak at 520 cm$^{-1}$ that is associated with the crystalline silicon phase. This Raman peak is, however, wider than the corresponding 520 cm$^{-1}$ peak in single-crystal silicon. As shown in FIG. 15, nanosecond annealing reduces the width of the 520 cm$^{-1}$ so that it is closer to the width of the peak in single-crystal silicon (the data depicted in this figure was obtained by using nanosecond pulses having a central wavelength of 308 nm).

Figure 14A:
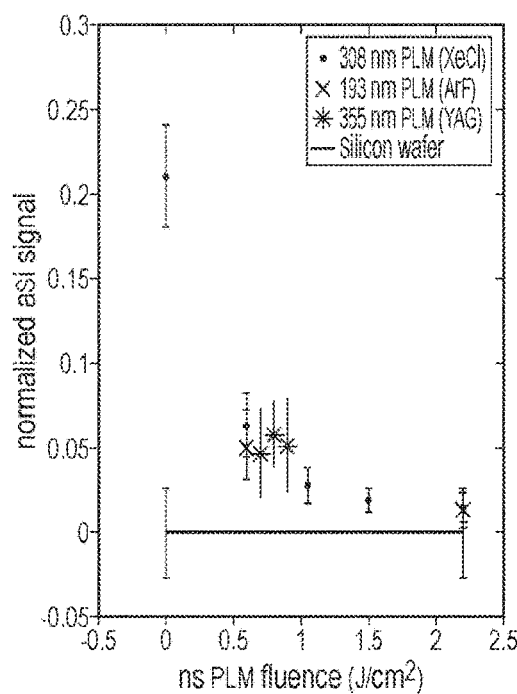
FIGS. 14A-14B shows measured percent recrystallization as a function of the fluence of the applied nanosecond pulses (14B) and the ratio of the area under the Raman peak for amorphous silicon to the area under 520 cm$^{-1}$ peak also as a function of the fluence of the applied nanosecond pulses (14A).
Figure 14B:
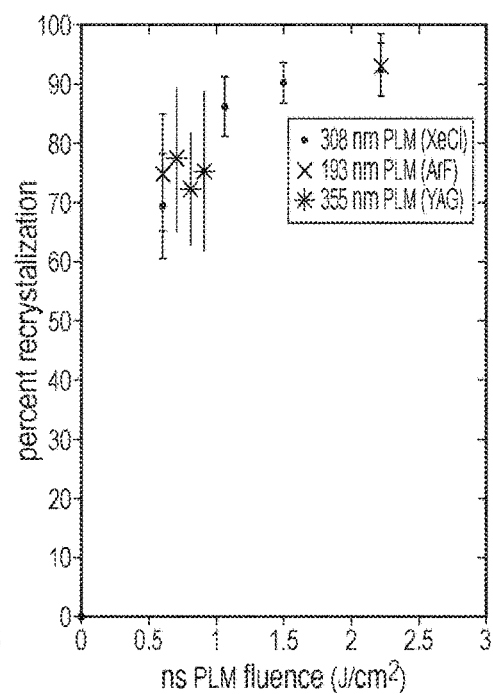

FIG. 14A shows measured percent recrystallization as a function of the fluence of the applied nanosecond pulses and FIG. 14B shows the ratio of the area under the 520 cm$^{-1}$ peak after treating hyperdoped black silicon samples with nanosecond annealing pulses relative to the area under the respective peak for a crystalline silicon, indicating that a recrystallization in a range of about 70% to over 90% was achieved.

Effects of ns Annealing and RTA on Electrical Conductance

Figure 16A:
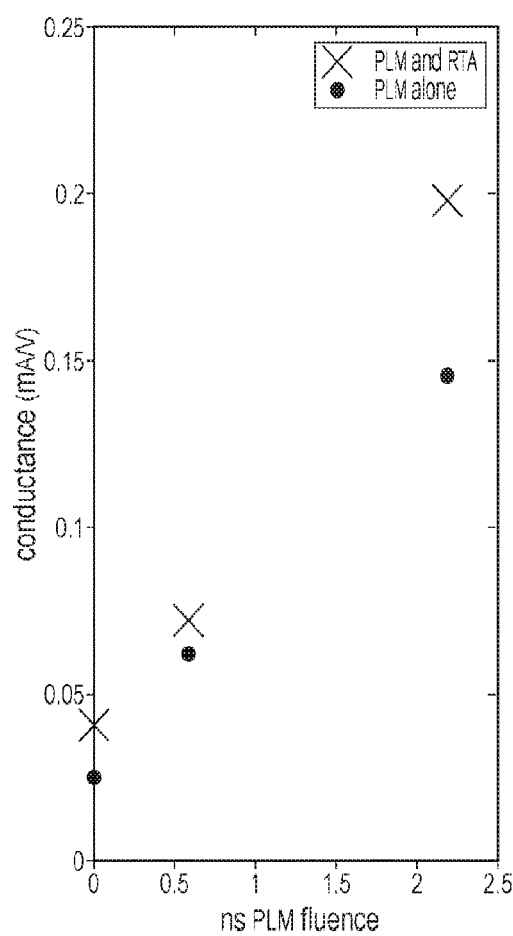
FIGS. 16A-16B depict the surface electrical conductance of a number of samples, some of which were treated with RTA and some were not, as a function of the fluence of the applied nanosecond annealing pulses (16A) and the increase in surface electrical conductivity of samples treated with nanosecond annealing pulses (with and without RTA treatment) relative to the surface electrical conductivity of untreated hyperdoped black silicon (16B).
Figure 16B:
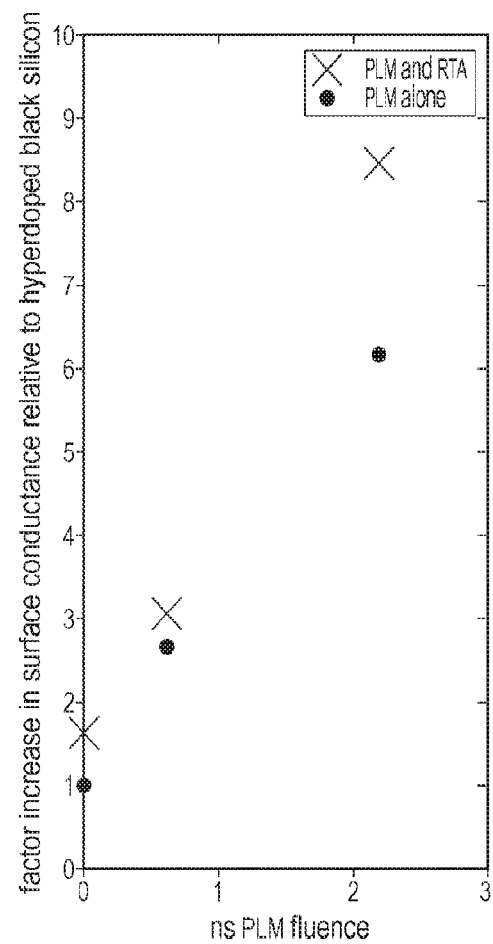

It was also observed that nanosecond annealing increases the surface electrical conductance of the hyperdoped black silicon by a factor in a range of 1-10. FIG. 16A depicts the surface electrical conductance of a number of samples, some of which were treated with RTA and some were not, as a function of the fluence of the applied nanosecond annealing pulses. FIG. 16B depicts the increase in surface electrical conductivity of samples treated with nanosecond annealing pulses (with and without RTA treatment) relative to the surface electrical conductivity of untreated hyperdoped black silicon. FIG. 16B shows that rapid thermal annealing (RTA) at a temperature of 500 C for 30 seconds in a $N_2$ atmosphere, performed subsequent to irradiation of the sample with nanosecond annealing pulses, resulted in further increase in surface electrical conductance.

Effect of ns Annealing on Electrical Rectification

The fabricated hyperdoped black silicon exhibited electrical rectification with a turn-on voltage of about 1-1.5 V.

Figure 17A:
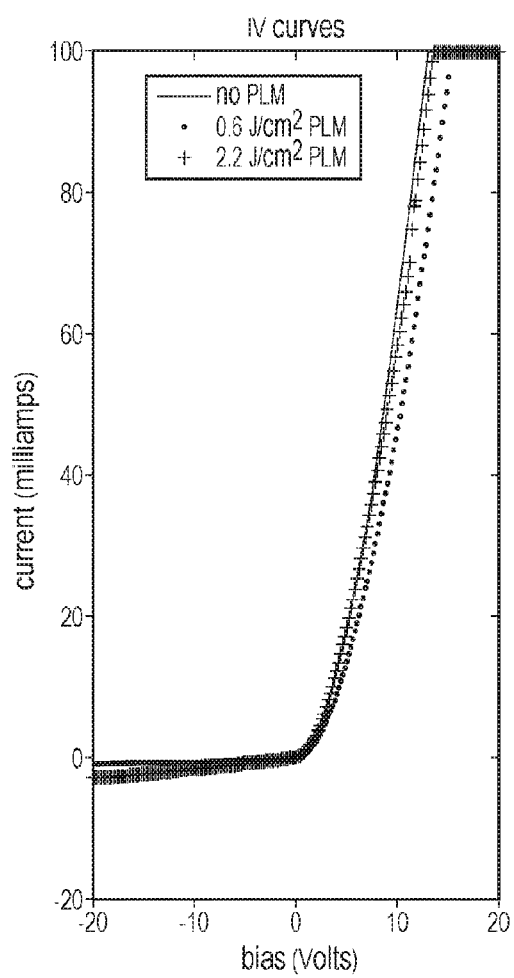
FIGS. 17A-17B show that the electrical rectification remained essentially unaltered after the hyperdoped black silicon was subjected to nanosecond annealing (17A) and illustrate second derivative of I-V curves of a number of samples prepared under a variety of conditions (17B).
Figure 17B:
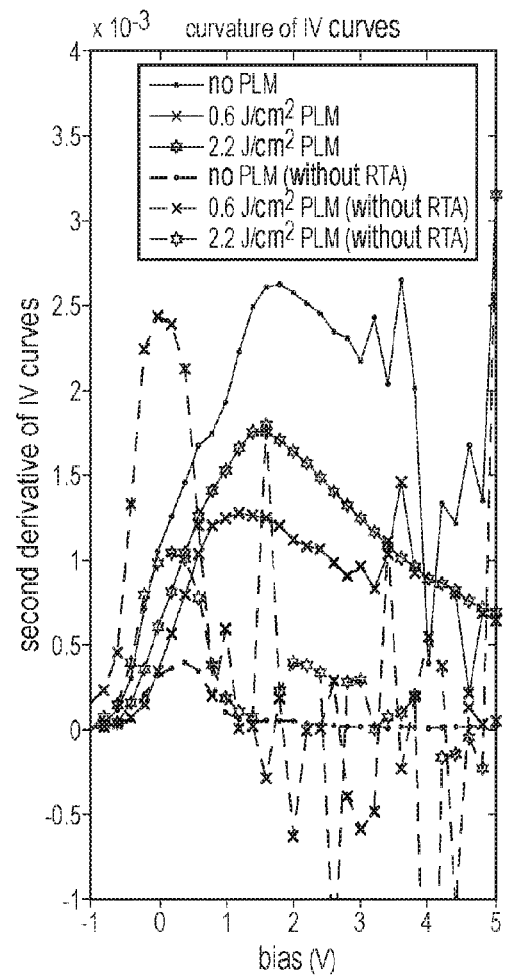

Referring to FIGS. 17A and 17B, after depositing metal contacts on hyperdoped black silicon treated with ns annealing pulses (Ti/Ni/Ag; Ti next to silicon), a turn-on voltage of about 0.5 V was measured, which is believed to be due to the formation of a Schottky barrier. After subjecting the wafer to rapid thermal annealing at a temperature of 500° C. for 30 seconds in a $N_2$ atmosphere, the turn-on voltage was measured to be about 1.5 V, which is believed to be associated with the junction between the doped surface layer and the underlying p-type silicon. Rapid thermal annealing of the hyperdoped black silicon was also performed at temperatures of 200, 300, and 400° C. The minimum temperature at which a turn-on voltage of about 1.5 V was observed was 500 C.

FIG. 17A shows that the electrical rectification remained essentially unaltered after the hyperdoped black silicon was subjected to nanosecond annealing. FIG. 17B depicts second derivative of I-V curves of a number of samples prepared under a variety of conditions.

Effect of ns Annealing on Optical Absorptance

Figure 18A:
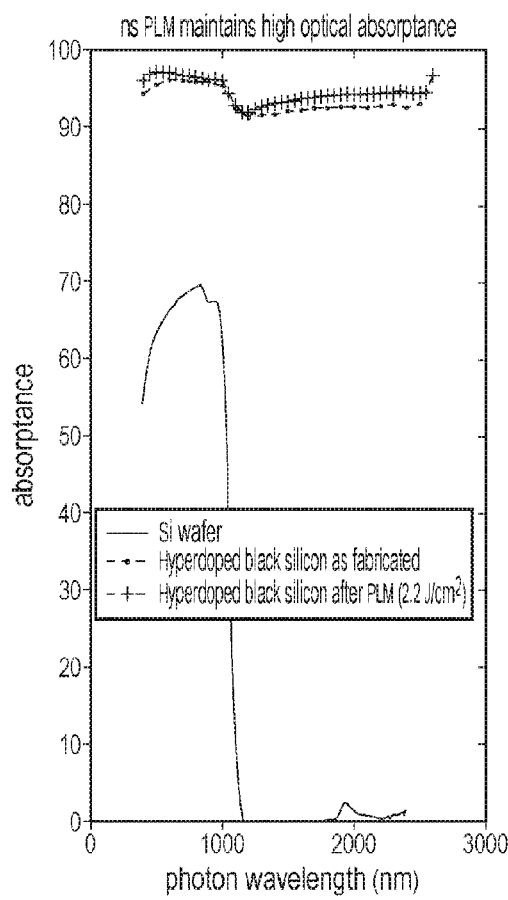
FIGS. 18A-18B show that hyperdoped black silicon treated with ns annealing pulses maintains the high absorptance exhibited by hyperdoped black silicon and shows that treating a hyperdoped black silicon with RTA at a temperature of 500° C. for 30 seconds ($N_2$ atmosphere) resulted in a reduction in sub-bandgap absorptance and that subsequent treatment of such a sample with nanosecond annealing pulses restored the sub-bandgap absorptance (6B).

Hyperdoped black silicon shows high optical absorptance above and below the bandgap energy. After treating hyperdoped black silicon with ns annealing, the high absorptance is maintained or increased. For example, FIG. 18A shows that hyperdoped black silicon treated with ns annealing pulses maintains the high absorptance exhibited by hyperdoped black silicon.

Figure 18B:
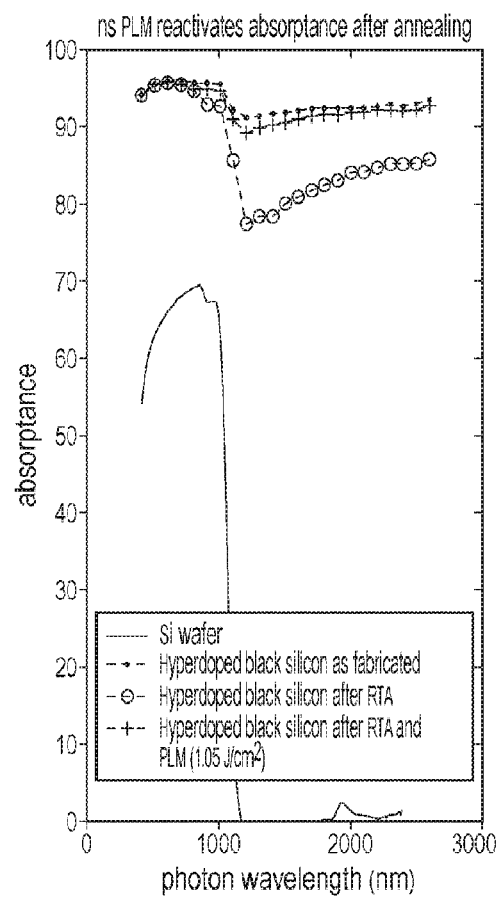

Thermal annealing has been shown to reduce the subbandgap absorptance in hyperdoped black silicon. FIG. 18B shows that treating a hyperdoped black silicon with RTA at a temperature of 500° C. for 30 seconds ($N_2$ atmosphere) resulted in a reduction in sub-bandgap absorptance. FIG. 18B also shows that subsequent treatment of such a sample with nanosecond annealing pulses restores the sub-bandgap absorptance.

Effect of RTA on Optical Absorptance

Figure 19:
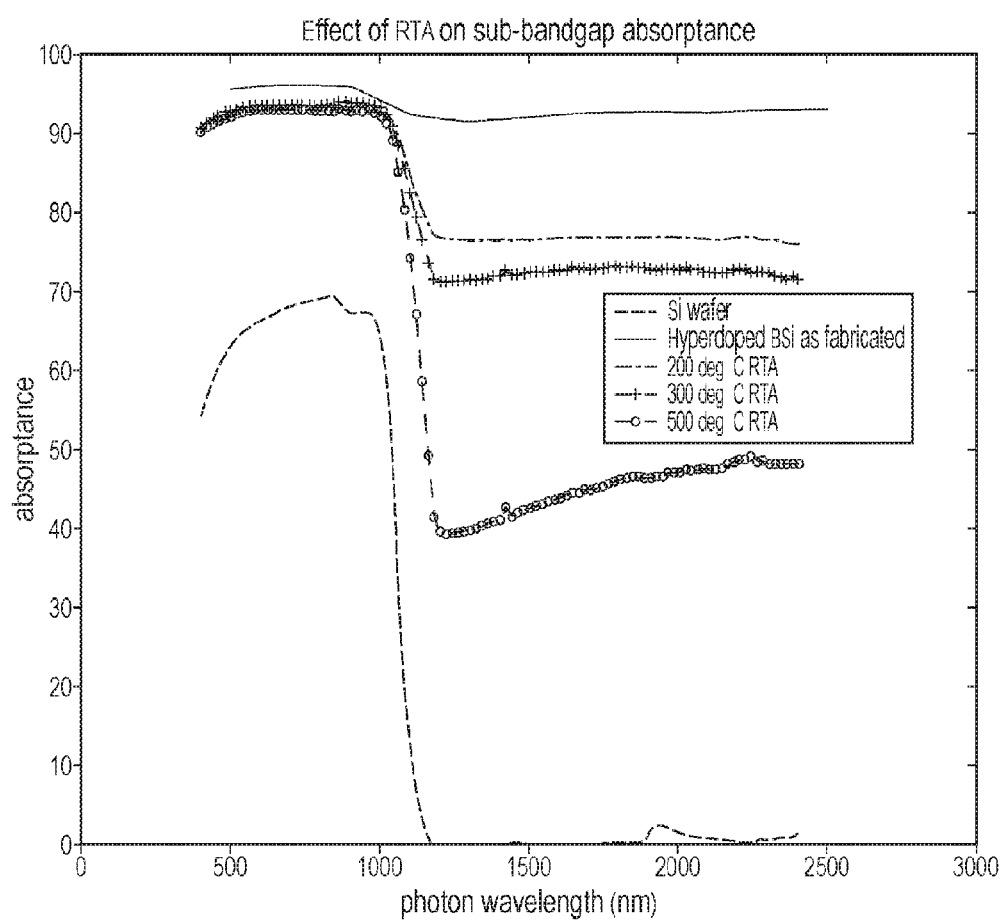
FIG. 19 illustrates the effect of RTA on sub-bandgap absorptance.

As depicted in FIG. 19, it was observed that subjecting a hyperdoped black silicon to RTA (30 seconds) decreases the sub-bandgap absorptance for thermal annealing temperatures of 200° C. to 500° C. with samples annealed at 500° C. showing a broad absorption peak above a wavelength of 2.5 micrometers Without being limited to a particular theory, the broad peak above a wavelength of 2.5 microns might be due to either free-carrier absorptance or an intermediate band to conduction band transition centered around 0.4 eV (3.1 microns).

Effect of ns Annealing on Surface Morphology

Figure 20A:
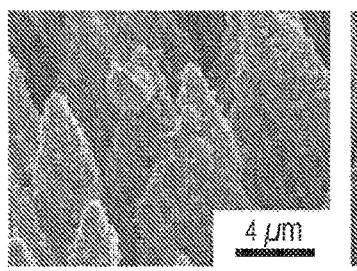
FIGS. 20A-20C show scanning electron microscope images of hyperdoped black silicon before nanosecond pulsed laser annealing treatment (20A) and after pulsed laser annealing treatment at various fluences (20B and 20C).
Figure 20B:
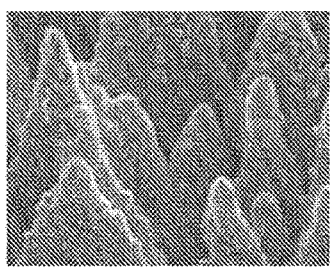
Figure 20C:
Figure 21A:
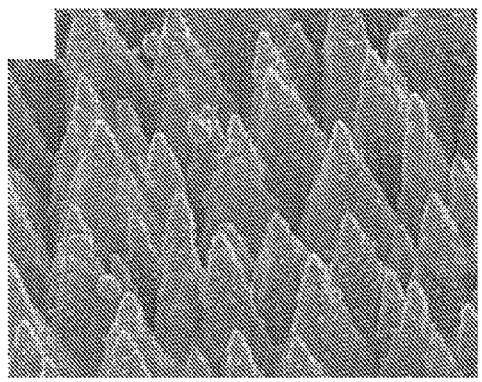
FIGS. 21A-21D illustrate (21A) hyperdoped black silicon (fabricated with a fs-laser pulse fluence of 8 kJ/m2) with nm-scale granular structures overlying conical structures about 10 μm in height and 5±2 μm in width. (Image obtained at 45-degree angle without foreshortening correction); (21B) Nanosecond laser annealing (here, with a fluence of 2.2 J/cm$^2$) causes smoothing of the nm-scale granular structures while keeping the 10-μm-scale conical structures intact; (21C) Cross-section of a conical surface structure before ns laser annealing shows nm-scale surface roughness and contrast-producing pockets within the conical surface structure. BF-TEM imaging of the surface with enhanced diffraction contrast (inset indicated by box 300 nm wide) shows an amorphous skin (a-Si) 50-100 nm thick between the crystalline core (c-Si) and the protective carbon and platinum layers (C, Pt). In this imaging mode, bend contours are observed in the crystalline core but do not appear in the amorphous skin; (21D) Cross-section of a conical surface structure after ns laser annealing (again, with a fluence of 2.2 J/cm$^2$) shows smoothing of nm-scale surface roughness and removal of contrast-producing pockets within the conical surface structure. BF-TEM imaging of the surface (upper inset indicated by box 300 nm wide) shows crystalline material throughout. Selected area electron diffraction (lower inset indicated by circled area) indicates that the core is single crystalline ([110] zone axis).
Figure 21B:
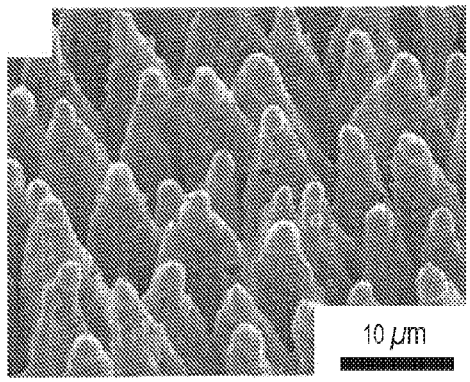
Figure 21C:
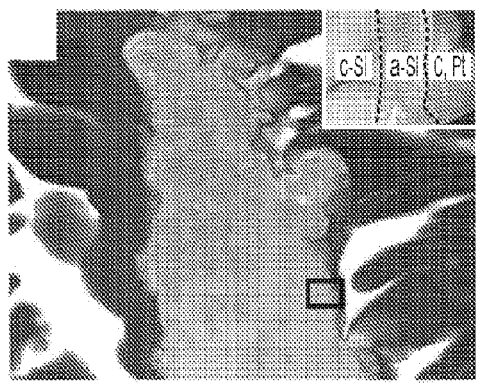
Figure 21D:
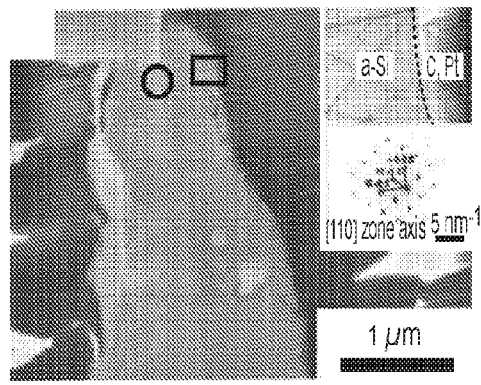

Nanosecond pulsed laser annealing causes some modification of the hyperdoped black silicon surface due to surface melting. For sufficiently large black silicon spikes, this surface modification takes the form of nanometer-scale smoothing and does not decrease the optical absorptance of the surface (see absorption data above). FIGS. 20A, 20B, and 20C show scanning electron microscope images of hyperdoped black silicon before nanosecond pulsed laser annealing treatment (FIG. 20A) and after pulsed laser annealing treatment at various fluences (FIGS. 20B and 20C).

Example 2

Methods and Materials

Hyperdoped black silicon was fabricated by irradiating a silicon wafer with fs laser pulses in the presence of sulfur hexafluoride ($SF_6$) gas. A monocrystalline silicon wafer (p-type, boron-doped, 7-14 ohm-cm) was placed in a vacuum chamber, which was evacuated to <0.1 Torr and then filled with sulfur hexafluoride gas to a pressure of 500 Torr. Femtosecond laser pulses (800 nm, 100-fs pulse duration, 1 kHz repetition rate) were output by a Ti:sapphire regenerative amplifier, passed through a computer-controlled mirror galvanometer, directed into the vacuum chamber, and focused onto the silicon surface so that a pulse diameter of 0.5-1 mm (full width at half maximum (FWHM) of the Gaussian pulse) was obtained. The laser pulses were scanned across the silicon surface so that each site on the surface was exposed, on average, to 200 laser pulses, and the pulse energy and pulse diameter were controlled so that each pulse had a fluence of 8 $kJ/m^2$. Each time 4 $cm^2$ of the surface was irradiated, the vacuum chamber was evacuated and refilled with new sulfur hexafluoride gas in order to prevent ablated particles from the silicon surface from accumulating in the chamber. The hyperdoped black silicon samples in this study were 1×1 $cm^2$ in area. Between batches of samples (groups of samples made on different days), some variation in the size and shape (e.g., the aspect ratio) of the resulting surface structures when using the same nominal fs laser irradiation parameters was observed, which might result from uncertainties in estimating the fs laser pulse fluence or instabilities in the fs laser. These variations in surface structures caused variations in the optical absorptance between batches of samples. Therefore, samples from the same batch in optical absorptance measurements were compared. In addition to the samples fabricated with a fs-laser pulse fluence of 8 $kJ/m^2$, samples were fabricated with a fluence of 2.5 $kJ/m^2$, which yielded smaller conical surface structures.

Then, hyperdoped black silicon was irradiated with ns laser pulses. Nanosecond laser pulses were generated by ArF (193 nm) and XeCl (308 nm, 25 ns FWHM pulse duration) excimer lasers and a Nd:YAG laser (355 nm, 4 ns FWHM pulse duration). The laser fluence was controlled by focusing the beam to increase the fluence or by reflecting a portion of the beam off of a quartz window to decrease the fluence, and the pulses were passed through a metal mask with a 3×3 $mm^2$ square opening to improve the uniformity of the pulse intensity profile, resulting in uniform pulses with fluences of 0.6-2.2 $J/cm^2$. The laser pulses were then scanned across the hyperdoped black silicon surface in ambient air. Typically, each site on the hyperdoped black silicon surface was exposed to 1 nanosecond laser pulse, though exposures of up to 40 pulses were carried out to determine the effects of multiple exposures.

The crystallinity of the hyperdoped black silicon surface was measured using Raman spectroscopy. For Raman spectrum measurements, a 10 mW HeNe laser beam (632.8 nm) was passed through a 50× objective lens (resulting in a spot diameter of 5 micrometers on the hyperdoped black silicon surface) and projected onto a CCD using a diffraction grating with 1200 grooves/mm, producing Raman spectra with a spectral wavenumber resolution of 2.0 cm$^{-1}$. After subtracting a baseline from the measured spectrum, the crystallinity of the hyperdoped black silicon surface was determined by normalizing the area under the spectral curve from 470-490 cm$^{-1}$ (containing the broad transverse-optical vibrational mode of amorphous silicon centered at 480 cm$^{-1}$ by the area under the spectral curve from 515-525 cm$^{-1}$ (containing the sharp optical vibrational mode of crystalline silicon at 520 cm$^{-1}$). The width (FWHM) of the crystalline silicon peak at 520 cm$^{-1}$ was also measured. Results from pristine monocrystalline silicon wafers were used as references. Measurements from each sample were averaged between 100 spectra collected within a 15×15 µm$^2$ grid in order to account for possible variations over the surface.

The surface morphology of the hyperdoped black silicon using a field emission scanning electron microscope (FE-SEM) was investigated. Samples were imaged at an angle of 45 degrees without foreshortening correction, using an accelerating voltage of 3 kV and a working distance of 16 mm.

The microstructure of the hyperdoped black silicon was investigated using cross-sectional transmission electron microscopy (TEM) and selected area diffraction (SAD). TEM samples were prepared by lift-out in a dual-beam FIB/SEM. Protection layers of carbon and platinum were deposited in situ prior to lift-out. Thinning steps were performed at 30 kV with the final thinning at 5 kV, which has been shown to leave 2.5 nm of amorphous surface damage in silicon. TEM and SAD were performed with a field emission TEM operated at 200 kV. For imaging of bend contours, BF-TEM images were obtained several degrees off the zone axis with an objective aperture to enhance diffraction contrast.

The optical absorptance of the hyperdoped black silicon was measured using an ultraviolet-visible-near infrared (UV-VIS-NIR) spectrophotometer (for wavelengths of 0.4-2.5 µm) and a Fourier transformed infrared (FTIR) spectrometer (for wavelengths of 2.4-10.0 µm). Reflectance (R) and transmittance (T) spectra were measured with integrating spheres and were used to calculate the optical absorptance (A=1−R−T). The FTIR spectra were matched to the spectrophotometer spectra in the overlapping wavelength range (2.4-2.5 µm).

The current-bias behavior of the hyperdoped black silicon was measured with a probe station and parametric analyzer. To apply metal electrodes to the samples, the samples were cleaned in solvents (acetone, isopropanol, and water). Four 2×2 mm$^2$ square regions were defined with photoresist on the hyperdoped black silicon surface. A plasma clean was performed to remove organic debris (75 W, 40 sec., 40 sccm O$_2$) and the sample was dipped in hydrofluoric acid (HF) to remove the native surface oxide (5% HF solution, 1 min.). Electron beam evaporation was used to deposit Ti, Ni, and Ag (20 nm, 20 nm, and 200 nm thicknesses, respectively) on the hyperdoped black silicon surface. Thermal evaporation was used to deposit Al (200 nm thickness) on the silicon wafer surface reverse of the hyperdoped black silicon surface. The remaining photoresist was lifted off in heated acetone (80° C.), and the samples were cleaned in solvents (acetone, isopropanol, and water). After electrode deposition, rapid thermal annealing (200-500° C., 30 sec., N$_2$ atmosphere) was used to obtain ohmic contact between the electrodes and the silicon surface. To measure the current-voltage behavior of the hyperdoped black silicon, samples were placed on a metal chuck (with the Al electrode in contact with the chuck), and a tungsten probe was placed in contact with one of the Ti—Ni—Ag electrodes on the hyperdoped black silicon surface. The bias between the chuck and the probe was swept from −20 V to +20 V and the resulting current was measured. The four electrodes on each hyperdoped black silicon sample were used to check the consistency of the measurements. A pristine silicon wafer with Al electrodes on both sides was used as a reference.

Thermal annealing was used to crystallize the hyperdoped black silicon and deactivate its sub-bandgap optical absorptance. Samples were thermally annealed in a tube furnace at 700° C. for 30 min. in forming gas (95% N$_2$, 5% H, 300 sccm).

To test the effects of combining thermal annealing and nanosecond (ns) laser annealing in series, hyperdoped black silicon was fabricated with fs laser irradiation. The sample was then thermally annealed (700° C., 30 min., forming gas atmosphere) and ns laser annealing was performed (355 nm Nd:YAG pulse, 1.1 J/cm$^2$ fluence). Metal electrodes were deposited onto the sample and the sample was subjected to rapid thermal annealing (500° C., 30 sec., N$_2$ atmosphere), and ns laser annealing was performed again. Between each step, the sample's crystallinity, optical absorptance, and electrical rectification were measured.

Results

Fabrication with a fs-laser pulse fluence of 8 kJ/m$^2$ yielded hyperdoped black silicon with a rough surface morphology consisting of nm-scale granular structures overlying µm-scale conical structures, as shown in FIG. 21A-21D. Without being limited to any particular theory, the nm-scale granular structures might have originated as particulate debris generated by laser ablation and deposited onto the silicon surface during the fs laser irradiation process. The µm-scale conical structures in the hyperdoped black silicon were about 10 µm tall and 5±2 µm wide at the base, with variation between individual cones. The cones had an elliptical base, perhaps due to the linear polarization of the laser beam, with the base width about twice as great in one dimension as in the orthogonal dimension. BF-TEM images showed a thin, 50-100 nm skin layer of amorphous material on the surface of the conical structures as well as contrast-producing features within the conical structures, which may be small pockets of amorphous silicon. Consistent with previous studies, the hyperdoped black silicon showed amorphous silicon and pressure induced crystalline silicon phases in Raman spectra, near-unity optical absorptance of above- and below-bandgap photon energies, and deactivation of sub-bandgap absorptance after thermal annealing.

Nanosecond laser annealing of hyperdoped black silicon resulted in nm-scale smoothing of the surface leaving the 10-µm-scale conical structures intact, shown in FIGS. 21A-21D. After nm laser annealing, diffraction contrast imaging and SAD indicated that the surface was single-crystalline. Nanosecond laser annealing also removed most of the contrast-producing features within the conical structures.

Figure 22:
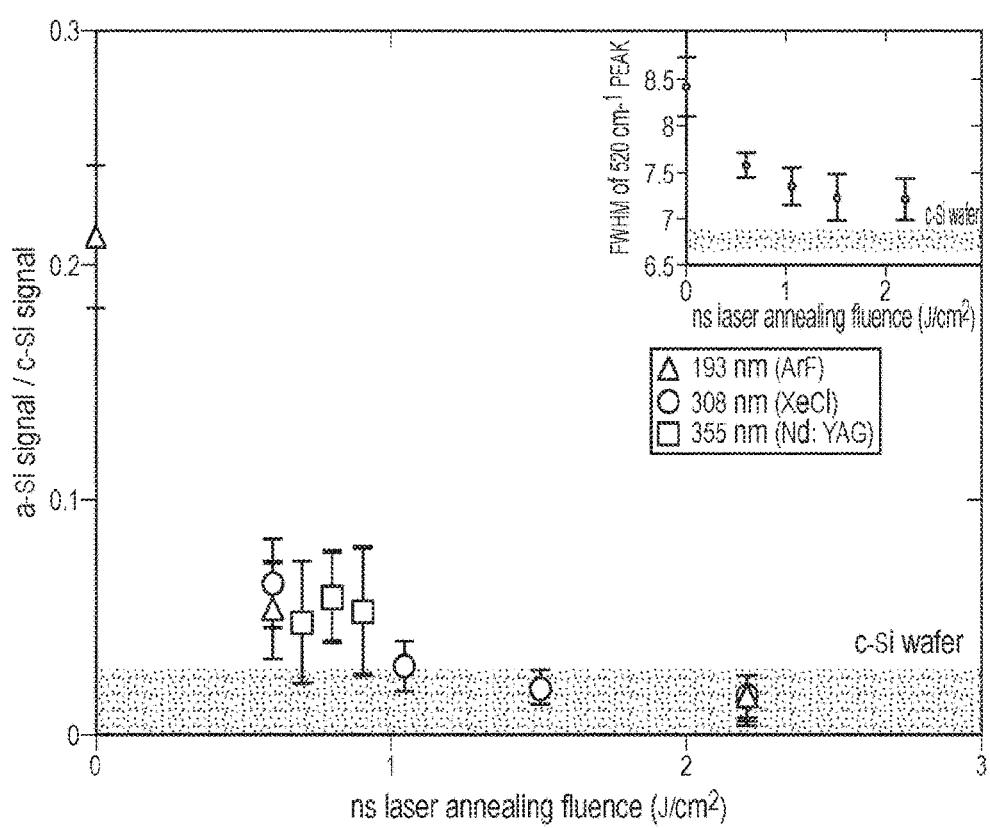
FIG. 22 illustrates the effect of nanosecond laser annealing on the crystallinity of hyperdoped black silicon as shown by Raman spectroscopy compared to a monocrystalline silicon wafer (gray box); the extent of crystallization depends on the fluence of the ns laser pulse.

Nanosecond laser annealing removed the amorphous and pressure-induced crystalline silicon phases shown in Raman spectra, as shown in FIG. 27. The lowest ns pulse fluence investigated (0.6 J/cm$^2$) was adequate to remove the pressure-induced crystalline silicon phases completely. The amount of amorphous silicon shown in Raman spectra decreased as the ns pulse fluence was increased, with pulse fluences greater than about 1.0 J/cm$^2$ yielding nearly undetectable amounts of amorphous silicon, as shown in FIG. 22. The decrease in amorphous silicon did not depend on the number of pulses (1-40 pulses), the pulse wavelength (193, 308, or 355 nm), or the pulse duration (4 or 25 ns). Nanosecond laser annealing also reduced the width (FWHM) of the crystalline silicon peak at 520 cm$^{-1}$, by about 1 cm$^{-1}$, shown in FIG. 22 inset. For example, the FWHM of the crystalline silicon peak was reduced from 8.4±0.3 cm$^{-1}$ (before ns laser annealing) to 7.3±0.3 cm$^{-1}$ (after ns laser annealing at fluences above 1.5 J/cm$^2$). Even after ns laser annealing, the peak width remained greater than that measured from pristine monocrystalline silicon (6.8±0.1 cm$^{-1}$). The peak width measured in monocrystalline silicon was greater than values reported in the literature, which could be due to the low spectral resolution of the Raman measurements. Nonetheless, a reduction in peak width of about 1 cm$^{-1}$ was consistently observed after ns laser annealing.

Figure 23:
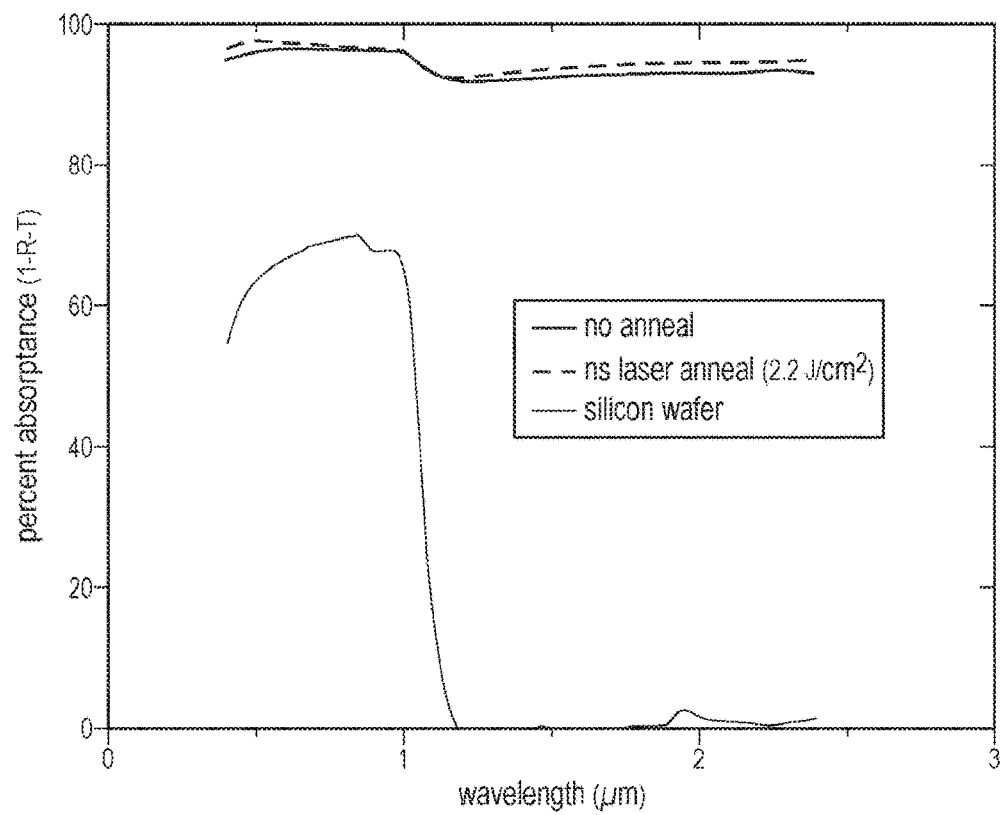
FIG. 23 illustrates the preservation of high above-bandgap and sub-bandgap optical absorptance after nanosecond laser annealing (here, fluence of 2.2 J/cm$^2$).

The optical absorptance of hyperdoped black silicon, including its sub-bandgap optical absorptance, remained high after ns laser annealing, as shown in FIG. 23. For example, after ns laser annealing with a pulse fluence of 2.2 J/cm$^2$ (the highest fluence investigated) the above-bandgap absorptance, (which was about 95%) remained unchanged, and the sub-bandgap absorptance (which was greater than 90%) increased slightly.

Figure 24:
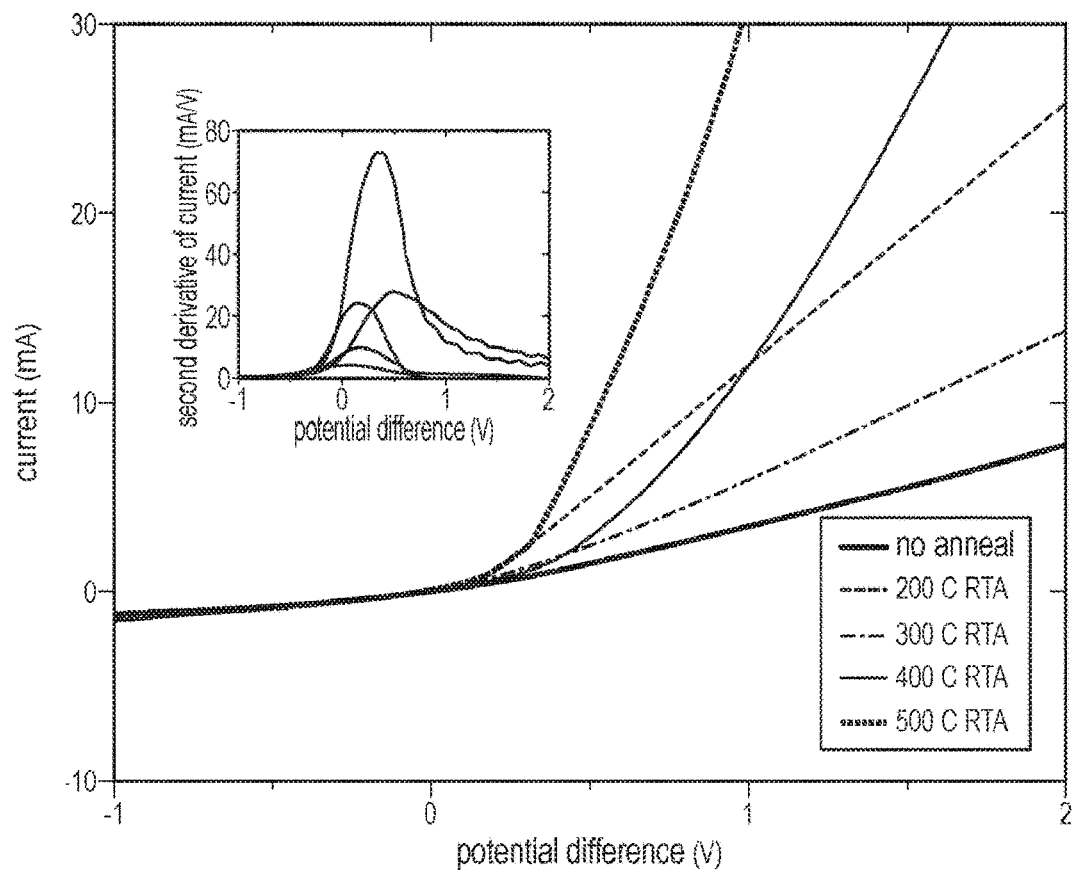
FIG. 24 illustrates an increase in of the turn-on voltage of hyperdoped black silicon diodes by rapid thermal annealing (RTA) after electrode deposition; higher rapid thermal annealing temperatures up to 500° C. (30 sec.) produced higher turn-on voltages (see inset); turn-on voltages around 0.2 V are typical of Schottky diodes, while turn-on voltages of around 0.7 V are typical of silicon homojunction diodes.
Figure 25:
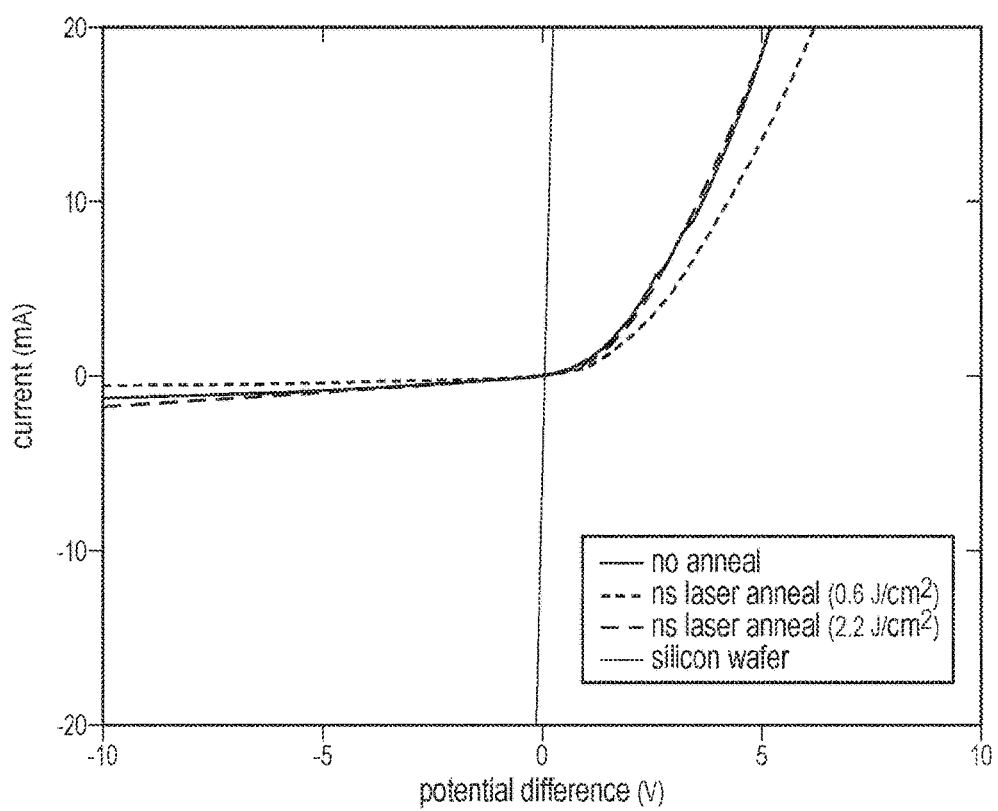
FIG. 25 illustrates electrical rectification in hyperdoped black silicon diodes is maintained after nanosecond laser annealing; diodes underwent rapid thermal annealing at 500° C. (30 sec.) after electrode deposition.

Obtaining consistent current-bias measurements required rapid thermal annealing at 500° C. for 30 sec. after electrode deposition. This rapid thermal annealing shifted the diode turn-on voltage (e.g., the point of greatest curvature in the current-bias curve) from 0.2±0.1 V to about 1 V (with some variation between samples), shown in FIG. 24. Rapid thermal annealing before electrode deposition had no effect on the current-bias measurements. Rapid thermal annealing did not decrease the presence of amorphous silicon, but it decreased the sub-bandgap optical absorptance, with higher annealing temperatures decreasing the absorptance further. Nanosecond laser annealing did not affect electrical current-bias behavior, shown in FIG. 25. Rectification ratios of 50±20 at ±10 V were obtained.

Figure 26:
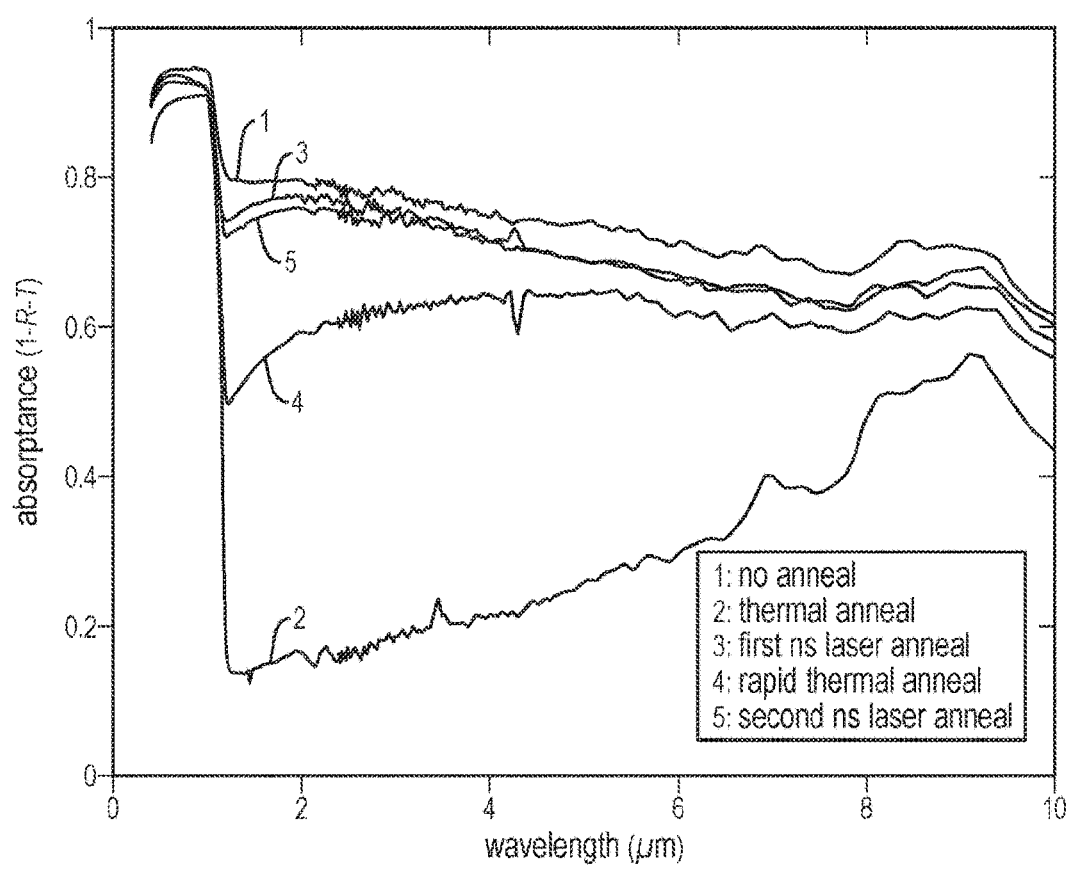
FIG. 26 illustrates the effect of thermal and ns laser annealing combined in series. Trace 1 shows that femtosecond-laser-fabricated hyperdoped black silicon exhibited high above-bandgap and sub-bandgap optical absorptance; trace 2 shows that thermal annealing (700° C., 30 min.)

After thermal annealing deactivated the sub-bandgap optical absorptance was deactivated with thermal annealing, ns laser irradiation annealing reactivated the sub-bandgap optical absorptance to near its original level. For example, after thermal annealing at 700° C. for 30 min., the sub-bandgap optical absorptance (1.2-4.0 μm wavelengths) was reduced from about 80% to about 20%, as shown in FIG. 26, and the amount of amorphous silicon was reduced to an undetectable level. Subsequent ns laser annealing with a pulse fluence of 1.1 J/cm$^2$ restored the sub-bandgap optical absorptance to 70-80% (with a broad sub-bandgap absorption peak at a wavelength of 2.0±0.8 micrometers, while maintaining high crystallinity). Subsequently, rapid thermal annealing reduced the sub-bandgap absorptance to about 60%. Finally, ns laser annealing again restored the sub-bandgap absorptance to 70-80%. The samples in FIG. 26 exhibit lower optical absorptance than the samples in FIG. 23 due to small variations in surface structure size between batches of samples.

Fabrication with a fs-laser pulse fluence of 2.5 kJ/m$^2$ yielded hyperdoped black silicon with smaller conical surface structures, which were about 1 μm in size (see FIG. 28). Before ns laser annealing, these samples exhibited amorphous and pressure-induced crystalline phases similar to unannealed hyperdoped black silicon with 10-μm surface structures (FIGS. 21A-21D and 22), above-bandgap optical absorptance of 90%, and sub-bandgap optical absorptance of 80% (see FIG. 29). After ns laser annealing with a fluence of 0.6 J/cm$^2$, the 1-μm conical surface structures remained intact, the amorphous and pressure-induced crystal phases were reduced to an undetectable level, and the sub-bandgap optical absorptance increased to 80-90%. After ns laser annealing with a higher fluence of 2.2 J/cm$^2$, the conical surface structures were largely destroyed, the above-bandgap optical absorptance dropped to 80-90%, and the sub-bandgap optical absorptance dropped to 60% (the amorphous and pressure-induced crystal phases were again reduced to an undetectable level).

Discussion

Nanosecond laser annealing produced three notable effects: (1) smoothing the surface on the nm scale, (2) converting amorphous and pressure-induced silicon phases to conventional crystalline silicon (Si-I), and (3) placing or maintaining the dopant atoms in optically active, non-equilibrium positions. The key to obtaining crystalline hyperdoped silicon that exhibits sub-bandgap optical absorptance is to produce a resolidification velocity that is less than the amorphization velocity of silicon (15 m/s) but still sufficient to produce solute trapping. With this method, a thin layer (e.g., 200 nm) of single-crystal hyperdoped silicon can be obtained. Processes that can interfere with the formation of single-crystal hyperdoped silicon include cellular breakdown (which can result in columnar crystals separated by dopant-rich boundaries and explosive crystallization of amorphous silicon (which can result in polycrystalline silicon containing nanometer-scale grains). The physical processes that occur during ns laser annealing of hyperdoped black silicon appear similar but more complex than these processes that occur during ns pulsed laser melting of flat hyperdoped silicon.

From cross-sectional TEM images of the conical surface structures (FIGS. 21A-21D), it was estimated that after fabrication with fs laser irradiation, the surface was covered with a 50-100 nm skin of amorphous, sulfur-bearing silicon. Below this skin layer and within the conical surface structures, contrast-producing features were visible which could be pockets of amorphous silicon within the crystalline silicon matrix. The removal of these contrast-producing features could be the result of heat diffusion into the conical surface structures during ns laser annealing. After ns laser annealing, the black silicon surface contains a skin of crystalline hyperdoped silicon, because BF-TEM imaging, SAD, and Raman spectra all indicate that the surface is crystalline and the strong sub-bandgap optical absorptance indicate that the surface was hyperdoped.

The melting depth from ns laser annealing with a fluence of 2.2 J/cm$^2$ was estimated to be about 100 nm on hyperdoped black silicon with 10 μm-scale structures, because the amorphous skin on the surface after fabrication with fs laser irradiation appeared to be 50-100 nm thick, and after ns laser annealing at fluences above 1.0 J/cm$^2$, little to no amorphous silicon was detected (FIG. 22). To verify this estimate, it was compared to the average melting depth expected from geometric optics. Although the laser intensity at the surface might be very inhomogeneous due to surface reflections and other effects, the aim was to determine whether 100 nm was a reasonable estimate for the average melting depth. The melting threshold fluence ns laser irradiation of flat amorphous silicon (248 nm wavelength) has been reported as 0.1-0.2 J/cm$^2$, which have been verified in laser-induced melting simulations. However, the conical surface structures increased the surface area of black silicon relative to flat silicon and thus reduced the average effective fluence of the laser pulse, in this case by a factor of about 4 (because surface cones with a height of 10 μm and a diameter of 5 μm increased the surface area by a factor of 4). At the same time, the surface reflectance of the amorphous silicon decreased from 0.6 to 0.1 due to light-trapping, indicating that about twice as much energy was absorbed by a hyperdoped black silicon surface than by a flat amorphous silicon surface for a given laser pulse fluence. Therefore, it was estimated that an average melting threshold fluence for hyperdoped black silicon was 0.35-0.7 J/cm$^2$, and that a ns laser pulse fluence of 1.0 J/cm$^2$ on the hyperdoped black silicon examined produced an average melting depth similar to that produced by a ns laser pulse with a fluence of 0.2-0.4 J/cm$^2$ on flat amorphous silicon. Indeed, simulations and experiments showed that this fluence range on flat amorphous silicon yields melting depths of 50-150 nm, in agreement with this estimate of 100 nm. The melting depths at the peaks of the conical surface structures and in the valleys between the structures could be expected to be greater than the estimates, as these surfaces are closer to normal incidence to the ns laser pulses than are the side walls of the conical surface structures. Indeed, the most prominent melting visible in SEM images of the surface after ns laser annealing appears at the peaks of the surface structures. Because crystalline silicon has a higher melting threshold than amorphous silicon (0.7-0.8 J/cm$^2$ compared to 0.1-0.2 J/cm$^2$), as well as a higher heat of fusion, it is expected that fluences greater than those required to melt the amorphous skin (i.e., greater than about 1.0 J/cm$^2$) cannot produce melting depths extending far beyond the amorphous skin depth, although high fluences could be effective at crystallizing amorphous silicon pockets within the conical surface structures through heat diffusion. The result that additional ns laser pulses do not lead to additional increases in crystallinity suggests that the first ns pulse produces a melting depth that is similar to or greater than the melting depth produced by subsequent ns pulses, which is consistent with the higher melting threshold and latent heat of fusion of crystalline silicon. The melting depths and dynamics may not depend significantly on the laser wavelength within the range investigated (193-355 nm), because the optical absorption depth in silicon was fairly uniform in this range (5-10 nanometers), and the amount of crystallization measured after ns laser annealing did not depend on the ns laser wavelength.

Nanosecond laser annealing also smoothed the surface on the nm scale while leaving the 10-μm-scale structures intact. Nanometer-scale smoothing can improve conformality during subsequent deposition of electrodes or additional semiconductor layers. Maintaining the μm-scale structures, on the other hand, leaves the light-trapping properties of the surface intact. The 1-μm-scale conical surface structures made with a fs laser fluence of 2.5 kJ/m$^2$, in contrast, were destroyed by high-fluence nm laser annealing (2.2 J/cm$^2$), which reduced light-trapping effectiveness. Nanosecond laser annealing on 1-μm-scale conical surface structures could be interesting, because such structures produce considerable light-trapping effects, can be crystallized without being destroyed by using low-fluence ns laser annealing (e.g., 0.6 J/cm$^2$), could potentially be fabricated on thin silicon substrates, and could be easier to integrate into devices (e.g., easier to contact electrically) than 10-μm-scale structures Nanosecond laser annealing also reduced the width of the Raman crystalline silicon peak at 520 cm$^{-1}$ (FIG. 22 inset). Lattice stress and small grain sizes can increase the width of the 520 cm$^{-1}$ peak as well as shift the peak to lower wavenumbers. The reduction in peak width after ns laser annealing can indicate a reduction in lattice stress and/or an increase in grain size. Because the spectral resolution of the Raman measurements was only 2.0 cm$^{-1}$, peak shifts to lower wavenumbers might result in an apparent increase in peak width. After ns laser annealing, the peak width was still greater than that from a pristine silicon wafer, indicating the presence of residual lattice stress, perhaps from the above-equilibrium concentration of dopant atoms.

The increase in the turn-on voltage of the hyperdoped black silicon diodes after rapid thermal annealing (FIG. 24) can be due to the removal of Schottky barriers that form at the metal-semiconductor interface during electrode deposition. Consistent with this interpretation, the turn-on of 0.2±0.1 V after electrode deposition was typical of Schottky diodes, while the turn-on voltage after rapid thermal annealing of 0.5-1.5 V was more consistent with the turn-on voltage of around 0.7V that is typical of silicon homojunction diodes. Furthermore, when rapid thermal annealing was performed before the electrodes were deposited, the turn-on voltage remained at 0.2±0.1 V, and no changes in crystallinity were detected after rapid thermal annealing, indicating that the increase in turn-on voltage was not due to changes in the hyperdoped black silicon itself, but rather changes within the electrode or in the electrode-silicon interface. Indeed, rapid thermal annealing has been reported to reduce the defect state density of defect states at silicon interfaces. The fact that the current-bias curves showed rectification both before and after ns laser annealing (FIG. 25) indicated that in hyperdoped black silicon containing amorphous regions, a rectifying junction can still be formed, perhaps in localized crystalline regions.

Nanosecond laser annealing reactivated the sub-bandgap optical absorptance after it was deactivated by thermal annealing as shown in FIG. 26. The deactivation of sub-bandgap optical absorptance, which is associated with an increase in electron mobility and changes in sheet carrier concentration, has been explained using the Johnson-Mehl-Avrami-Kolmogorov framework describing diffusion-mediated changes in metastable supersaturated solid solutions such as hyperdoped silicon. However, the reactivation of the sub-bandgap optical absorptance after heating and fast cooling suggests that the degree of departure from room-temperature equilibrium of the dopant atoms, as reflected by the placement of the dopant atoms within the lattice, can be reversible and important for describing the properties of hyperdoped silicon, similar to the way in which fictive temperature is important in describing the properties of glasses, another non-equilibrium material. Reactivation has been previously reported when deactivated hyperdoped silicon was irradiated with fs laser pulses or heated to temperatures above 1350 K followed by fast cooling (e.g., in silicone oil, yielding estimated cooling rates of about 250 K/s). Reactivation by ns laser annealing was found to be more complete than what has been previously reported and produced or maintained high crystallinity, unlike reactivation by fs laser pulses, which typically produces a layer of amorphous silicon.

Combined thermal and ns laser annealing in series demonstrated the versatility of combining equilibrium with non-equilibrium processing techniques (FIG. 26). In practice, an initial thermal annealing step can be useful for increasing crystallinity or obtaining electrical rectification, but can lead to deactivation of sub-bandgap optical absorptance. Subsequent ns laser annealing can then reactivate the optical absorptance while maintaining high crystallinity. Similarly, rapid thermal annealing can be necessary to obtain ohmic contact after electrode deposition, but, again, some deactivation of the optical absorptance can occur. Another application of ns laser annealing can reactivate the optical absorptance to near its original level. Overall, a small drop in above-bandgap absorptance was observed after ns laser annealing of about 5% absolute from an increase in surface reflectance, probably due to smoothing of the surface. The final ns laser annealing step also removed the metal electrodes. In practice, removal of the electrodes might be avoided by using thicker electrodes, more robust electrode materials, transparent electrodes, or by shielding the electrodes with a mask during ns laser annealing. The combination of thermal and ns laser annealing can produce hyperdoped black silicon that is highly crystalline, highly absorptive to above- and below-bandgap wavelengths, and electrically rectifying. The process serves as an illustration of the versatility of combining thermal and ns laser annealing.

The main challenge is to obtain high crystallinity and high sub-bandgap optical absorptance concurrently, which was accomplished with ns laser annealing. In silicon hyperdoped with sulfur, selenium or tellurium, the doping concentration can yield an intermediate band can below 0.4 at. %, with the best figures of merit below 0.1 at. %. Silicon that is hyperdoped with sulfur, selenium, or tellurium above 0.4 at. % is metallic and therefore not expected to produce significant optoelectronic (photoconductive or photovoltaic) response.

Conclusion

Nanosecond laser annealing can crystallize and remove pressure-induced phases from the surface of hyperdoped black silicon while maintaining a light-trapping surface morphology and high sub-bandgap optical absorptance. Additionally, ns laser annealing can reactivate the sub-bandgap optical absorptance after it has been deactivated by thermal annealing. Furthermore, ns laser annealing does not interfere with the formation of rectifying homojunctions in hyperdoped black silicon. Thermal annealing and ns laser annealing can be combined in sequence to produce hyperdoped black silicon that is highly crystalline, showed high above-bandgap and sub-bandgap optical absorptance, and was electrically rectifying. The effects of ns laser irradiation on hyperdoped black silicon were not highly sensitive to laser wavelength, pulse duration, or number of pulses used.

Because ns laser annealing is based on physical processes of melting/heating and fast resolidification/cooling, it can be applied to other non-equilibrium material systems beyond hyperdoped black silicon. The combination of equilibrium processing techniques (e.g., thermal annealing) with non-equilibrium processing techniques (e.g., ns laser annealing) could be a useful approach for controlling the properties of non-equilibrium materials.

Fabricating optoelectronic devices using hyperdoped black silicon presents a number of challenges, including concurrently controlling the crystallinity, optical absorptance, dopant concentration, and hyperdoped layer thickness. Here, ns laser annealing on hyperdoped black silicon obtained high crystallinity and optical absorptance while also maintaining electrical rectification. Methods to control the dopant concentration and hyperdoped layer thickness in hyperdoped black silicon can be important for fabricating sub-bandgap optoelectronic devices.

Those having ordinary skill in the art will appreciate that various changes can be made to the above embodiments without departing from the scope of the invention.

What is claimed is:

1. A method of processing a semiconductor substrate, comprising:
   incorporating at least one dopant in a semiconductor substrate so as to generate a doped polyphase surface layer,
   optically annealing said surface layer via exposure to a plurality of laser pulses having a pulsewidth in a range of about 1 nanosecond to about 50 nanoseconds so as to enhance crystallinity of said doped surface layer,
   wherein said incorporating step comprises:
   irradiating a surface of the semiconductor substrate with one or more laser pulses having a pulse width in a range of about 10 femtoseconds to about 10 picoseconds while exposing said substrate surface to any of said dopant and a compound having said dopant as a constituent.

2. The method of claim 1, wherein said incorporating step results in formation of a plurality of light-trapping surface textures in a top surface of said surface layer.

3. The method of claim 2, wherein said optically annealing step substantially preserves said light-trapping surface textures.

4. The method of claim 2, wherein said surface textures are characterized by a plurality of undulations having a peak-to-trough amplitude in a range of about 100 nanometers to about 100 micrometers.

5. The method of claim 3, wherein said optically annealed doped surface layer exhibits an absorptance in a range of about 50% to 100% for said at least one sub-bandgap wavelength.

6. The method of claim 5, wherein said thermal annealing step comprises exposing said doped surface layer to an elevated temperature in a range of about 200 deg. C. to about 1400 deg. C.

7. The method of claim 1, wherein said optically annealed doped surface layer exhibits an absorptance for at least one sub-bandgap wavelength equal to or greater than about 50%.

8. The method of claim 1, wherein said optically annealed doped surface layer has a thickness in a range of about 10 nm to about 1 micrometer.

9. The method of claim 8, wherein said optically annealed doped surface layer has a thickness in a range of about 10 nm to about 200 nm.

10. The method of claim 1, wherein said optical annealing step results in at least 50% recrystallization of said polyphase doped surface layer.

11. The method of claim 10, wherein said semiconductor substrate comprises silicon and said dopant comprises a chalcogen.

12. The method of claim 1, wherein said optical annealing step results in at least 80% recrystallization of said polyphase doped surface layer.

13. The method of claim 1, wherein said dopant has a concentration greater than solid solubility limit of said dopant in said semiconductor.

14. The method of claim 1, wherein said dopant has a concentration in a range of about 0.01 to about 1.5 atom percent in said semiconductor surface layer.

15. The method of claim 1, wherein said dopant is any of an electron-donating and a hole-donating species.

16. The method of claim 1, further comprising the step of thermally annealing said doped surface layer prior to said optical annealing step.

17. The method of claim 1, wherein said optical annealing laser pulses have a central wavelength in a range of about 195 nm to about 1200 nm.

18. The method of claim 17, wherein said dopant comprises a chalcogen.

19. The method of claim 17, wherein said step of incorporating at least one dopant in said substrate comprises bringing a substrate surface into contact with a gas containing any of said dopant and a compound having said dopant as a constituent.

20. The method of claim 17, wherein said step of incorporating at least one dopant in said substrate comprises applying a film containing any of said dopant and a compound having said dopant as a constituent to a surface of said substrate.

21. The method of claim 17, wherein said optical annealing laser pulses have a central wavelength in a range of about 195 nm to about 355 nm.

22. The method of claim 1, wherein said optical annealing laser pulses have a fluence in a range of about 0.1 to about 2.5 J/cm$^2$.

23. The method of claim 1, wherein said optically annealed doped surface layer forms a diode junction with underlying bulk substrate.

24. The method of claim 1, wherein said substrate is any of silicon, germanium, silicon carbide, and gallium arsenide.

25. A method of processing a semiconductor substrate, comprising:
    incorporating at least one dopant in a semiconductor substrate so as to generate a doped polyphase surface layer by irradiating a surface of the semiconductor substrate with one or more laser pulses having a pulsewidth in a range of about 10 femtoseconds to about 1 picosecond,
    optically annealing said surface layer via exposure to a plurality of laser pulses having a pulsewidth in a range of about 1 nanosecond to about 50 nanoseconds so as to enhance crystallinity of said doped surface layer,
    wherein said optical annealing laser pulses have a central wavelength in a range of about 195 nm to about 355 nm.

26. The method of claim 25, wherein said semiconductor substrate is any of silicon, germanium, silicon carbide, and gallium arsenide.

27. The method of claim 25, wherein said optically annealed doped surface layer forms a diode junction with underlying bulk substrate.

* * * * *